(12) United States Patent  
Kuramochi et al.

(10) Patent No.: US 9,111,663 B2
(45) Date of Patent: Aug. 18, 2015

(54) SINTERED COMPOSITE OXIDE, MANUFACTURING METHOD THEREFOR, SPUTTERING TARGET, TRANSPARENT CONDUCTIVE OXIDE FILM, AND MANUFACTURING METHOD THEREFOR

(75) Inventors: Hideto Kuramochi, Ayase (JP); Hitoshi Iigusa, Ayase (JP); Tetsuo Shibutami, Ayase (JP)

(73) Assignee: TOSOH CORPORATION, Yamaguchi (JP)

( * ) Notice: Subject to any disclaimer, the term of this patent is extended or adjusted under 35 U.S.C. 154(b) by 206 days.

(21) Appl. No.: 13/876,080

(22) PCT Filed: Sep. 27, 2011

(86) PCT No.: PCT/JP2011/072092
§ 371 (c)(1),
(2), (4) Date: Mar. 26, 2013

(87) PCT Pub. No.: WO2012/043571
PCT Pub. Date: Apr. 5, 2012

(65) Prior Publication Data
US 2013/0181173 A1   Jul. 18, 2013

(30) Foreign Application Priority Data

Sep. 29, 2010  (JP) ................................. 2010-218536

(51) Int. Cl.
*H01B 1/08* (2006.01)
*C23C 14/00* (2006.01)
(Continued)

(52) U.S. Cl.
CPC .. *H01B 1/08* (2013.01); *C01G 9/02* (2013.01); *C01G 23/003* (2013.01);
(Continued)

(58) Field of Classification Search
CPC  H01B 1/08; C04B 2235/3284; C23C 14/086; C01G 9/02
See application file for complete search history.

(56) References Cited

U.S. PATENT DOCUMENTS

2009/0134013 A1  5/2009  Takahashi et al.
2009/0197757 A1  8/2009  Fukushima
2013/0048060 A1* 2/2013  Akiike et al. ................ 136/252

FOREIGN PATENT DOCUMENTS

EP   2623480 A1 * 8/2013
JP   9-45140      2/1997
(Continued)

OTHER PUBLICATIONS

Pillai et al "Crystallization and phase transition characteristics of sol-gel synthesized zinc titanates", Jan. 1, 2011 Dublin Institute of Technology: Antenna and High Frequency Research Center.*

(Continued)

*Primary Examiner* — Mark Kopec
(74) *Attorney, Agent, or Firm* — Greenblum & Bernstein, P.L.C.

(57) ABSTRACT

A sintered composite oxide 2 composed mainly of zinc, aluminum, titanium and oxygen, the atomic ratio of the elements satisfying the following equations (1) to (3), the sintered composite oxide 2 comprising particles having a hexagonal wurtzite structure containing zinc oxide as the major component and having a mean particle size of no greater than 20 μm, and particles having a $ZnTiO_3$-like structure and/or $Zn_2Ti_3O_8$-like structure containing aluminum and titanium and having a mean particle size of no greater than 5 μm, and containing no particles with a spinel oxide structure of zinc aluminate with zinc and aluminum in solid solution, and a manufacturing method for the same.

$$(Al+Ti)/(Zn+Al+Ti)=0.004-0.055 \quad (1)$$

$$Al/(Zn+Al+Ti)=0.002-0.025 \quad (2)$$

$$Ti/(Zn+Al+Ti)=0.002-0.048 \quad (3)$$

[In the equations, Al, Ti and Zn represent the contents (atomic percents) of aluminum, titanium and zinc, respectively.]

9 Claims, 5 Drawing Sheets

(51) Int. Cl.
  *C23C 14/08* (2006.01)
  *C01G 23/00* (2006.01)
  *C04B 35/453* (2006.01)
  *C23C 14/34* (2006.01)
  *C23C 14/35* (2006.01)
  *C01G 9/02* (2006.01)
  *C04B 35/626* (2006.01)

(52) U.S. Cl.
  CPC .......... *C04B 35/453* (2013.01); *C04B 35/6261* (2013.01); *C04B 35/6262* (2013.01); *C04B 35/62685* (2013.01); *C23C 14/08* (2013.01); *C23C 14/086* (2013.01); *C23C 14/3407* (2013.01); *C23C 14/3414* (2013.01); *C23C 14/35* (2013.01); *C01P 2002/52* (2013.01); *C01P 2006/40* (2013.01); *C04B 2235/3217* (2013.01); *C04B 2235/3232* (2013.01); *C04B 2235/3234* (2013.01); *C04B 2235/3284* (2013.01); *C04B 2235/5409* (2013.01); *C04B 2235/5436* (2013.01); *C04B 2235/604* (2013.01); *C04B 2235/656* (2013.01); *C04B 2235/6562* (2013.01); *C04B 2235/6565* (2013.01); *C04B 2235/6567* (2013.01); *C04B 2235/77* (2013.01); *C04B 2235/786* (2013.01); *C04B 2235/80* (2013.01)

(56) References Cited

FOREIGN PATENT DOCUMENTS

| | | |
|---|---|---|
| JP | 11-236219 | 8/1999 |
| JP | 11-236219 | * 11/1999 |
| JP | 11-322332 | 11/1999 |
| JP | 2008-063214 | 3/2008 |
| JP | 4295811 | 7/2009 |
| JP | 2009-263709 | 11/2009 |
| JP | 2009-298649 | 12/2009 |
| JP | 2010-120803 | 6/2010 |
| JP | 2011-093717 | 5/2011 |
| JP | 2011-93717 | * 5/2011 |
| WO | 2008/013237 | 1/2008 |
| WO | 2008/018402 | 2/2008 |
| WO | 2009/078330 | 6/2009 |

OTHER PUBLICATIONS

Search report from International Application No. PCT/JP2011/072092, mail date is Jan. 10, 2012.

International Preliminary Report on Patentability PCT/JP2011/072092, mail date is Apr. 18, 2013.

Office Action in Chinese Application No. 201180047525.5, mail date is Nov. 26, 2013.

* cited by examiner

SINTERED COMPOSITE OXIDE, MANUFACTURING METHOD THEREFOR, SPUTTERING TARGET, TRANSPARENT CONDUCTIVE OXIDE FILM, AND MANUFACTURING METHOD THEREFOR

TECHNICAL FIELD

The present invention relates to a sintered composite oxide, to a manufacturing method for the same, to a sputtering target, and to a transparent conductive oxide film and a manufacturing method for the same.

BACKGROUND ART

Transparent conductive oxide films have high transmittance in the visible region and high conductivity, and are used in electrodes of liquid crystal display units or various light receiving elements such as solar cells. They are also widely used in thermic ray reflective coatings and antistatic films for automobile and construction materials, and anti-fogging transparent heating units in freezer showcases and the like. One such transparent conductive oxide film that is used is a zinc oxide-based film having an element such as aluminum, gallium or boron added to zinc oxide. Aluminum oxide-added zinc oxide-based films, in particular, have excellent light transmittance in the infrared region, and are therefore suited for purposes that are highly dependent on optical transparency, such as solar cells.

Film-forming methods used for such transparent conductive oxide films include sputtering methods employing sputtering targets, because they allow formation of films with uniform film thicknesses over large areas. However, such sputtering methods have been associated with problems, including a reduced operating rate of the sputtering apparatus due to anomalous discharge that occurs during sputtering, and lower product yield due to the effect of generated particles.

As means for minimizing anomalous discharge produced during sputtering, PTL 1 discloses a ZnO-based sintered material containing 3 to 7 atomic percent Al, and 0.3 to 3 atomic percent of at least one third element selected from the group consisting of B, Ga, In, Ge, Si, Sn and Ti. However, with the compositional control described in PTL 1, it is not possible to sufficiently minimize anomalous discharge during sputtering. It is therefore desirable to even further reduce anomalous discharge.

A film obtained using a sputtering target must exhibit not only the properties of low resistance and high transmittance in a wide wavelength range, and especially not only in the visible region but also in the infrared region, and high stability (durability) of the film properties. Based on experimentation by the present inventors, however, films obtained using the sputtering target of PTL 1 do not readily exhibit both high optical transparency in a wide wavelength range, and especially in the infrared region, and high stability (durability) of the film properties.

Also, while in terms of optical transparency, transmittance is exhibited at specific wavelengths of 550 nm and 1000 nm, for practical use it is important for high transmittance to be obtained not only at specific wavelengths but also across the entire wavelength range demanded for the purpose of use. When durability has been increased with the film of PTL 1, it has been found that the transmittance is reduced in the long wavelength range of longer than the wavelength of 1000 nm mentioned in the examples. It is desirable to ameliorate this phenomenon for purposes that depend on optical transparency, such as a solar cell.

PTL 2 discloses a ZnO-based sintered material that (1) has a major compositional phase which is a ZnO phase with solid solution of 0.2-14 atomic percent of at least one element selected from the group consisting of B, In, Al, Ga, Ge, Sn, Si and Ti, (2) has a sintered density of 4.5 g/cm$^3$ or greater, (3) has a volume resistivity of no greater than 1 kΩcm and (4) has a mean crystal grain size of 2-20 μm. However, PTL 2 does not contain examples of adding Al and Ti in combination, nor does it contain any mention of the composition or properties.

PTL 3 discloses a zinc oxide sintered material containing at least one element from among Al, Ga, In, Ti, Si, Ge and Sn added to ZnO. The zinc oxide sintered material has precipitates each containing a composite oxide phase of the added element and zinc, and voids formed surrounding the precipitates. There is also disclosed a zinc oxide sintered material wherein, of the precipitates, the proportion of precipitates with a circle equivalent diameter of at least 3 μm is no greater than 20%, and of the voids, the proportion of voids with a circle equivalent diameter of at least 3 μm is no greater than 50%.

Further disclosed is a zinc oxide sintered material containing, with ZnO, one first added element from among Al, Ga, In, Ti, Si, Ge and Sn, and a second added element which is at least one element from among Al, Ga, In, Ti, Si, Ge and Sn, which has not been added as the first added element. The zinc oxide sintered material is disclosed as a zinc oxide sintered material having a co-present zone wherein a first precipitate comprising a composite oxide phase of the first added element and zinc and a second precipitate comprising a composite oxide phase of the second added element and zinc are co-present in a zinc oxide phase as the main phase.

However, it is not possible to sufficiently minimize anomalous discharge during sputtering simply by controlling the microstructure in the sintered material (the compositional phase and its particle sizes and void diameters), as disclosed in PTL 3. Furthermore, it is impossible to avoid problems such as decreased yield due to particles that fly off during sputtering, and the resulting loss of productivity. It is therefore desirable to even further reduce anomalous discharge.

On the other hand, PTL 4 has disclosed a zinc oxide-based transparent conductive film containing Al and Ti, as a thin-film containing such elements. However, PTL 4 is based on a chip-on film forming method that employs DC magnetron sputtering. In this process, a portion of the element composing the thin-film is formed as a chip and placed on the target for sputtering. Hence, it contains no disclosure regarding the sintered material (sputtering target).

In light of the goal of improving light transmittance in the infrared region, it is also known that zinc oxide films with reduced aluminum oxide addition and zinc oxide films containing no aluminum oxide as added material, provide highly superior light transmittance in the infrared region. Their durability has been poor, however, and it has been difficult to achieve both high transmittance in the infrared region and high durability.

CITATION LIST

Patent Literature

[PTL 1] Japanese Unexamined Patent Application Publication HEI No. 11-236219
[PTL 2] Japanese Unexamined Patent Application Publication HEI No. 11-322332
[PTL 3] Japanese Unexamined Patent Application Publication No. 2008-063214

[PTL 4] Japanese Unexamined Patent Application Publication HEI No. 9-045140

SUMMARY OF INVENTION

Technical Problem

It is an object of the present invention to provide a sputtering target that can adequately inhibit anomalous discharge, a transparent conductive oxide film obtained using the sputtering target, and a manufacturing method for the same. It is another object to provide a sintered composite oxide that can be used as such a sputtering target, and a manufacturing method for the same.

Solution to Problem

The present inventors have conducted much diligent research in light of the circumstances described above. Focus was placed on sputtering methods using sputtering targets, as film-forming methods for transparent conductive oxide films, because they allow formation of films with uniform film thicknesses over large areas. It was found that if a sintered composite oxide with a specific composition and structure is used as the sputtering target in a sputtering method, it is possible to control anomalous discharge in the film formed by sputtering, to minimize reduction in yield due to particles. Then, there were obtained a sintered composite oxide that can yield a transparent conductive oxide film with excellent light transmittance in the infrared region and excellent durability, a sputtering target, and a transparent conductive oxide film obtained using it, and the invention was thereupon completed.

Specifically, according to one aspect, the invention provides a sintered composite oxide composed mainly of zinc, aluminum, titanium and oxygen, wherein the atomic ratio of the elements composing the sintered material satisfies the following equations (1) to (3).

$$(Al+Ti)/(Zn+Al+Ti)=0.004-0.055 \quad (1)$$

$$Al/(Zn+Al+Ti)=0.002-0.025 \quad (2)$$

$$Ti/(Zn+Al+Ti)=0.002-0.048 \quad (3)$$

The sintered material comprises particles having a hexagonal wurtzite structure containing mainly zinc oxide and having a mean particle size of no greater than 20 μm, and particles having a $ZnTiO_3$-like structure and/or $Zn_2Ti_3O_8$-like structure containing aluminum and titanium and having a mean particle size of no greater than 5 μm, and containing no particles with a spinel oxide structure of zinc aluminate with zinc and aluminum in solid solution.

The sintered composite oxide of the invention preferably includes no aluminum oxide particles or titanium oxide particles.

According to another aspect, the invention provides a manufacturing method for the aforementioned sintered composite oxide. The manufacturing method for a sintered composite oxide has a step in which a powder as an aluminum source and a powder as a titanium source are pre-mixed and calcined to obtain a first mixed powder with a mean particle size of no greater than 1 μm, a step in which zinc oxide powder is added to and mixed with the first mixed powder to obtain a second mixed powder satisfying the following equations (1), (2) and (3) represented as the atomic ratios of the metal elements, and a step in which the second mixed powder is molded and fired at 800° C. to 1500° C. to obtain a sintered composite oxide.

$$(Al+Ti)/(Zn+Al+Ti)=0.004-0.055 \quad (1)$$

$$Al/(Zn+Al+Ti)=0.002-0.025 \quad (2)$$

$$Ti/(Zn+Al+Ti)=0.002-0.048 \quad (3)$$

[In equations (1), (2) and (3), Al, Ti and Zn represent the contents (atomic percents) of aluminum, titanium and zinc, respectively.]

According to yet another aspect, the invention provides a sputtering target comprising the aforementioned sintered composite oxide. The sputtering target preferably has a sputtering surface with a center line average roughness Ra of no greater than 3 μm.

According to yet another aspect, the invention provides a manufacturing method for a transparent conductive oxide film that includes a step of using the aforementioned sputtering target for sputtering, and a transparent conductive oxide film obtained by the manufacturing method.

Advantageous Effects of Invention

The sintered composite oxide of the invention may be suitably used as a sputtering target. Specifically, this may be used for sputtering to produce a transparent conductive oxide film, while minimizing anomalous discharge during sputtering. The obtained transparent conductive oxide film has excellent optical transparency not only in the visible region but also in the infrared region, and excellent durability. Therefore, when it is used in a solar cell, for example, it can utilize sunlight energy in the infrared region in a highly efficient manner, which has been inadequate in the prior art. It is thus possible to provide a solar cell with high photoelectric conversion efficiency. The term "solar cell", as used herein, includes solar cells that employ transparent conductive oxide films, such as silicon-based solar cells employing single crystal silicon, polycrystalline silicon and amorphous silicon, compound-based solar cells such as $CuInSe_2$, $Cu(In,Ga)Se_2$, GaAs and CdTe, and dye-sensitized solar cells.

DESCRIPTION OF EMBODIMENTS

Preferred embodiments of the invention will now be explained.

(Sintered Composite Oxide)

Figure 1:
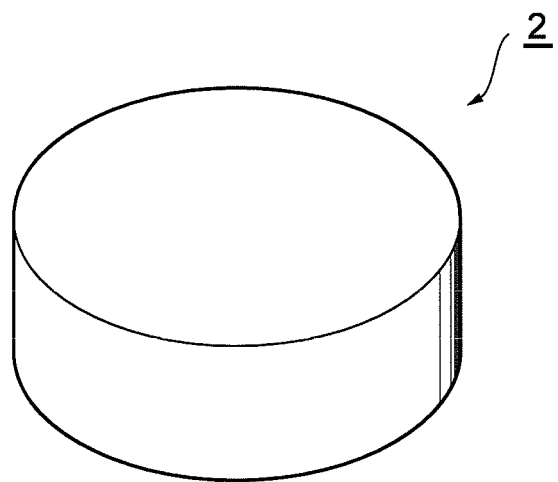
FIG. 1 is an oblique view schematically showing a preferred embodiment of a sintered composite oxide of the invention.

FIG. 1 is an oblique view schematically showing a sintered composite oxide of this embodiment. The sintered composite oxide 2 of this embodiment is composed mainly of zinc, aluminum, titanium and oxygen. That is, the sintered composite oxide 2 contains zinc, aluminum, titanium and oxygen as the major elements. The total content of zinc, aluminum and titanium with respect to all of the cation elements in the sintered composite oxide 2 is 97 atomic percent or greater. The content is preferably 98 atomic percent or greater, more preferably 99 atomic percent or greater and even more preferably 100 atomic percent, from the viewpoint of obtaining a transparent conductive oxide film with even higher properties. Thus, the sintered composite oxide 2 may contain elements different from zinc, aluminum, titanium and oxygen, but their amounts are preferably low.

The ratio of the content of elements in the sintered composite oxide 2 (atomic percent), i.e. the atomic ratio, satisfies the following equations (1) to (3).

$$(Al+Ti)/(Zn+Al+Ti)=0.004\text{-}0.055 \quad (1)$$

$$Al/(Zn+Al+Ti)=0.002\text{-}0.025 \quad (2)$$

$$Ti/(Zn+Al+Ti)=0.002\text{-}0.048 \quad (3)$$

In equations (1), (2) and (3), Al, Ti and Zn represent the contents (atomic percents) of aluminum, titanium and zinc, respectively.

By containing zinc, aluminum and titanium with these atomic ratios, the sintered composite oxide 2 of this embodiment has low resistance, and can yield a film with excellent light transmittance in the infrared region and visible region, and excellent durability. From the viewpoint of obtaining a transparent conductive oxide film with even more excellent light transmittance in the infrared region and more excellent durability, $(Al+Ti)/(Zn+Al+Ti)$ is preferably 0.005-0.05. From the same viewpoint, $Al/(Zn+Al+Ti)$ is preferably 0.003-0.02. From the same viewpoint, $Ti/(Zn+Al+Ti)$ is preferably 0.003-0.04 and even more preferably 0.003-0.03. According to the invention, it may also include unavoidable trace impurities.

The sintered composite oxide 2 comprises particles (A) having a hexagonal wurtzite structure containing zinc oxide as the major component and having a mean particle size of no greater than 20 μm, and (B) particles having a $ZnTiO_3$-like structure and/or $Zn_2Ti_3O_8$-like structure containing aluminum and titanium as constituent elements and having a mean particle size of no greater than 5 μm.

By limiting the mean particle size of particles (A) to no greater than 20 μm, it is possible to reduce anomalous discharge during sputtering, while also minimizing damage of the target during sputtering. The mean particle size of the particles (A) is preferably no greater than 10 μm. The lower limit will usually be 0.001 μm. In order to obtain a sintered composite oxide with a mean particle size of less than 0.001 μm, the starting powder used would have a mean primary particle size of less than 0.001 μm. When such a starting powder has been used, molding becomes very difficult and production efficiency tends to be lowered.

The particles (A) are a substance exhibiting a diffraction pattern attributed to the hexagonal wurtzite structure of zinc oxide in a X-ray diffraction test. The shapes and sizes of the particles (A) can be confirmed in detail by SEM and EPMA analysis. The zinc oxide content of the particles (A) is 80 atomic percent or greater, and preferably 90 atomic percent or greater, as zinc.

The mean particle size of the particles (B), on the other hand, is no greater than 5 μm. This can minimize anomalous discharge during sputtering. The mean particle size of the particles (B) is preferably no greater than 3 μm. This can further minimize anomalous discharge during sputtering. The lower limit for the mean particle size of the particles (B) will usually be 0.001 μm. In order to obtain a sintered composite oxide with a mean particle size of less than 0.001 μm, the starting powder used would have a mean primary particle size of less than 0.001 μm. When such a starting powder has been used, molding becomes very difficult and production efficiency tends to be lowered.

The particles (B) are a substance exhibiting a diffraction pattern attributable to a $ZnTiO_3$-like structure and/or $Zn_2Ti_3O_8$-like structure in a X-ray diffraction test. The shapes and sizes of the particles (B) can be confirmed in detail by SEM and EPMA analysis. The term "$ZnTiO_3$-like structure" includes the structure of $ZnTiO_3$ and analogous structures. The term "$Zn_2Ti_3O_8$-like structure" includes the structure of $Zn_2Ti_3O_8$ and analogous structures.

The method of measuring the mean particle sizes of the particles (A) and (B) in the sintered composite oxide 2 is as follows. Specifically, after the sintered composite oxide 2 is cut to an appropriate size, the observation plane is surface-polished. It is then subjected to chemical etching with a dilute acetic acid solution to render the grain boundaries distinct. Using an X-ray microanalyzer (EPMA), scanning electron microscope/energy dispersive X-ray analysis (SEM/EDS), X-ray diffraction (XRD) and the like, observational photographs of the polished surface are taken and the composition of each of the particles is confirmed. The long diameters of at least 500 of each of the particles (A) and (B) are measured in each observational photograph. The arithmetic mean value is recorded as the mean particle size.

For the particles (B), there is no particular restriction on the proportion of particles with a $ZnTiO_3$-like structure and particles with a $Zn_2Ti_3O_8$-like structure. However, preferably at least particles with a $ZnTiO_3$-like structure are present. This can further minimize anomalous discharge during sputtering. Also, more preferably the following equation is satisfied, where $A_x$ and $A_y$ are the diffraction intensities of the (311) plane of the main peak for particles with a $ZnTiO_3$-like structure and particles with a $Zn_2Ti_3O_8$-like structure, respectively, in a X-ray diffraction test.

$$A_x/(A_x+A_y)=0.05\text{-}1$$

This can still further minimize anomalous discharge during sputtering.

The presence of particles with a $ZnTiO_3$-like structure and particles with a $Zn_2Ti_3O_8$-like structure can be confirmed in the following manner. Specifically, particles with a $ZnTiO_3$-like structure are those having a diffraction peak, detected in the range of $2\Theta=30\text{-}40°$ with XRD using Cu as the line source, that can be indexed on the (210) plane, (211) plane, (220) plane, (300) plane, (310) plane, (311) plane and (320) plane, in the peak pattern for $ZnTiO_3$ in PDF (Powder Diffraction File) #00-039-0190 (RDB) of the ICDD (International Centre for Diffraction Data), or an analogous peak pattern (shifted peak pattern). The peak pattern shift will usually be within $\pm 1°$.

On the other hand, particles having a $Zn_2Ti_3O_8$-like structure are those that can be indexed on the (220) plane, (311) plane and (222) plane, in the peak pattern for $Zn_2Ti_3O_8$ in PDF#00-038-0500 of the ICDD, or an analogous peak pattern (shifted peak pattern). The peak pattern shift will usually be within $\pm 1°$.

Also, the (311) plane of the main peak of a $ZnTiO_3$-like structure and the (311) plane of the main peak of a $Zn_2Ti_3O_8$-like structure are diffracted at very close angles. It is therefore very difficult to separately confirm them. Utilizing the peak of the (210) plane of the $ZnTiO_3$-like structure, which is easy to separately confirm, and the relative intensity according to the ICDD, $A_x$ and $A_y$ are determined in the following manner. Specifically, calculation can be performed using the following formula, where $I_{(x+y)}$ is the total diffraction intensity on the (311) plane of the main peak for particles with a $ZnTiO_3$-like structure and particles with a $Zn_2Ti_3O_8$-like structure, and $I_{x(210)}$ is the diffraction intensity on the (210) plane for a $ZnTiO_3$-like structure.

$$A_x = I_{x(210)} \times (100/45)$$

$$A_y = I_{(x+y)} - A_x$$

Particles with a $Zn_2Ti_3O_8$-like structure may include particles with a $Zn_2TiO_4$-like structure, which is an analogous structure.

Particles (B) with a $ZnTiO_3$-like structure and/or $Zn_2Ti_3O_8$-like structure present in the sintered composite oxide 2 contain zinc, aluminum and titanium. On the other hand, the sintered composite oxide 2 does not contain particles with a spinel oxide structure of zinc aluminate with zinc and aluminum in solid solution. This can further minimize anomalous discharge during sputtering.

Throughout the present specification, the phrase "does not contain particles with a spinel oxide structure of zinc aluminate with zinc and aluminum in solid solution" has the following meaning. Specifically, it means that the diffraction pattern attributed to the spinel oxide structure of zinc aluminate $ZnAl_2O_4$, with zinc and aluminum in solid solution, is not detected in an X-ray diffraction test measured under the conditions used in the examples.

The sintered composite oxide 2 preferably includes no aluminum oxide particles or titanium oxide particles. That is, preferably all of the aluminum element and all of the titanium element in the sintered composite oxide 2 is present in the particles (A) and particles (B). This can further minimize anomalous discharge during sputtering.

The absence of aluminum oxide particles or titanium oxide particles can be confirmed by XRD. Specifically, no diffraction pattern attributed to aluminum oxide or titanium oxide should be observed when an X-ray diffraction test had been conducted under the conditions described in the examples of the present specification.

The relative density of the sintered composite oxide 2 is preferably 80% or greater. With such a relative density, a transparent conductive oxide film obtained using the sintered composite oxide as a sputtering target will exhibit high optical transparency in the infrared region, and even more excellent durability. It will also allow stable film formation while minimizing anomalous discharge during sputtering, and without producing damage in the target during sputtering.

The relative density of the sintered composite oxide of the invention is calculated in the following manner. Specifically, the weight ratios of Zn, Al and Ti in the sintered composite oxide are determined in terms of ZnO, $Al_2O_3$ and $TiO_2$, respectively. The weight ratios are recorded as a (%), b (%) and c (%), respectively. Next, the respective true densities, ZnO: 5.68 g/cm³, $Al_2O_3$: 3.99 g/cm³, $TiO_2$: 4.2 g/cm³, are used to calculate the theoretical density A (g/cm³) in the following manner.

$$A = (a+b+c)/((a/5.68)+(b/3.99)+(c/4.2))$$

The density B (g/cm³) of the sintered composite oxide is measured by the Archimedes' method, based on JIS-R1634-1998.

The relative density (%) is calculated by the following formula, as the relative value of the density B (g/cm³) of the sintered material with respect to the arithmetically calculated theoretical density A (g/cm³).

$$\text{Relative density (\%)} = (B/A) \times 100$$

As mentioned above, the sintered composite oxide 2 containing zinc, aluminum and titanium is composed of particles (A), and particles (B) having a $ZnTiO_3$-like structure and/or $Zn_2Ti_3O_8$-like structure containing aluminum and titanium as constituent elements and having a mean particle size of no greater than 5 μm. The sintered composite oxide 2 does not contain particles with a spinel oxide structure of zinc aluminate with zinc and aluminum in solid solution. In order to produce such a sintered composite oxide 2, it is necessary to control the production conditions as described below.

(Manufacturing Method for Sintered Composite Oxide)

The method comprises:

a calcining step in which a powder as the aluminum source and a powder as the titanium source is pre-mixed and calcined to obtain a mixed powder with a mean particle size of no greater than 1 μm, a powder preparation step in which the mixed powder and zinc oxide powder are mixed to a prescribed atomic ratio to prepare a molding powder, a molding step in which the molding powder is molded to produce a compact, and a firing step in which the compact is fired to produce a sintered material. Each step will now be explained in detail.

(1) Calcining Step

The starting powders to serve as the aluminum source and titanium source are not particularly restricted, and for example, there may be used aluminum-containing or titanium-containing metal oxide powders, metal hydroxide powders, metal salt powders such as chlorides, nitrates or carbonates, and metal alkoxides. From the viewpoint of handleability, metal oxide powders are preferred. Starting powders as zinc sources are available as inexpensive high-purity powders with excellent handleability. Zinc oxide powder is therefore used as a starting material. When non-metal oxide powders are used as the aluminum source and titanium source, the same effect is obtained if they are used as metal oxide powders after first subjecting the powder to heat treatment in an oxidizing atmosphere such as air. However, this requires heat treatment or the like, and complicates the process. It is therefore preferred to use a metal oxide powder as the starting powder.

The following explanation assumes the use of a metal oxide powder as the starting powder. A finer particle size of the metal oxide powder for the starting powder will result in superior homogeneity and sinterability of the mixture. Usually, therefore, it is preferred to use powder with a primary particle size of no greater than 10 μm, and most preferably powder of no greater than 1 μm. Powder of an element other than zinc is preferably an oxide powder with a smaller primary particle size than the primary particle size of the zinc oxide powder. If the primary particle size of the zinc oxide powder is a smaller or equivalent size, homogeneity of the mixture may be impaired.

The mean particle size of the zinc oxide powder is preferably greater than the mean particle size of the other metal oxide powder, of an element other than zinc. This will allow uniform mixing of the starting powders, and can yield a sintered composite oxide 2 comprising particles with a fine mean particle size.

The BET specific surface area of the zinc oxide powder and a metal oxide powder other than zinc is preferably 3 to 20 m²/g, from the viewpoint of handleability. It will thus be easier to obtain the sintered composite oxide 2. When the powder has a BET value of lower than 3 m²/g, it is preferably used after pulverizing treatment to a powder with a BET value of 3 to 20 m²/g. While a powder with a BET value of greater than 20 m²/g may be used, this increases the bulk of the powder. It is therefore preferred for the powder to be subjected to consolidation treatment beforehand, in order to improve handleability.

The values of $D_{sz}/D_{bz}$, $D_{sa}/D_{ba}$ and $D_{st}/D_{bt}$, where $D_{bz}$, $D_{ba}$ and $D_{bt}$ are the area-to-weight ratio diameters determined from the BET specific surface areas of the zinc oxide powder and each oxide powder of aluminum and titanium, and $D_{sz}$, $D_{sa}$ and $D_{st}$ are the mean particle sizes of each powder, are preferably each at least 1 and less than 50. Such a powder property will allow the sintered composite oxide 2 to be more suitably obtained. The area-to-weight ratio diameter can be determined by the following formula, assuming the primary particle of each powder to be spherical. In the formula, S represents the BET specific surface area (units: m²/g).

$$D_{bz}=6/(S\times 5.68)$$

$$D_{ba}=6/(S\times 3.99)$$

$$D_{bt}=6/(S\times 4.2)$$

The mean particle size of each powder is measured using a COULTER LS130 (trade name of Coulter Electronics), with a liquid module in distilled water. The measured value is based on volume.

Next, the powder is subjected to treatment such as dry or wet blending to obtain a mixed powder.

According to this embodiment, first the aluminum source powder and the titanium source powder are pre-mixed and calcined, and then the mean particle size is adjusted to no greater than 1 µm. There are no particular restrictions on the method of pre-mixing. Examples of methods of pre-mixing include wet and dry media agitation mill mixing using balls or beads of zirconia, alumina, nylon resin or the like, and media-less rotating vessel mixing and mechanical agitating mixing. Specifically, there may be used a ball mill, bead mill, attritor, vibrating mill, planetary mill, jet mill, V-shaped mixer, paddle mixer, biaxial planetary stirring mixer, or the like.

When a wet ball mill or bead mill, attritor, vibrating mill, planetary mill, jet mill or the like is used, the pulverized slurry must be dried. The drying method is not particularly restricted, and examples include filtration drying, fluidized bed drying and spray-drying. When a metal salt solution or alkoxide solution is to be used as the starting material, the precipitate deposited from the solution is dried.

Calcining of the obtained powder is preferably carried out at 600° C. to 1200° C., and more preferably at 800° C. to 1000° C. A retention time of 1 to 3 hours is sufficient. The obtained calcined powder is subjected to shredding treatment to a mean particle size of no greater than 1 µm, to obtain a pre-mixing powder. The treatment method for the shredding is not particularly restricted, and examples of mixing methods include those employing a dry or wet media agitation mill using balls or beads of zirconia, alumina, nylon resin or the like. Specifically, there may be used a ball mill, bead mill, attritor, vibrating mill, planetary mill, jet mill or the like. When a wet ball mill or bead mill, attritor, vibrating mill, planetary mill, jet mill or the like is used, the crushed slurry must be dried. The drying method is not particularly restricted, and examples include filtration drying, fluidized bed drying and spray-drying.

(2) Powder Preparation Step

Next, zinc oxide powder as a zinc source is mixed with the mixed powder with a mean particle size of no greater than 1 µm, obtained by the calcining step, to the final composition, to obtain a molding powder. Here, using zinc oxide powder as the zinc source can reduce the complexity of the process and minimize additional operations such as powder treatment. A zinc compound other than zinc oxide, such as a nitrate, chloride or carbonate, may be used after calcination to an oxide. The particle size of such a powder is preferably no greater than 1.5 µm and more preferably 0.1 to 1.5 µm, as the mean particle size, from the viewpoint of handleability. Using such a powder can provide an improving effect on the sintered material density. A molding powder, in particular, preferably has a mean particle size of no greater than 1 µm. This can improve the sinterability.

The purity of each starting powder will usually be 99 wt % or greater, preferably 99.9 wt % or greater and more preferably 99.99 wt % or greater. A low purity can adversely affect the properties of the transparent conductive oxide film formed by a sputtering target composed of the sintered composite oxide 2, due to impurities.

The final mixing ratios of the starting materials, i.e. the final composition, reflect the atomic ratios of the elements composing the sintered composite oxide 2 that is to be obtained. Therefore, mixing of the mixed powder and zinc oxide powder, during preparation of the molding powder, is accomplished with the atomic ratio of zinc, aluminum and titanium in a proportion that satisfies the following equations (1) to (3).

$$(Al+Ti)/(Zn+Al+Ti)=0.004\text{-}0.055 \qquad (1)$$

$$Al/(Zn+Al+Ti)=0.002\text{-}0.025 \qquad (2)$$

$$Ti/(Zn+Al+Ti)=0.002\text{-}0.048 \qquad (3)$$

The molding powder obtained in this manner is preferably granulated before molding. This can increase the flow property during molding, for superior productivity. The granulation method is not particularly restricted, and may be spray-drying granulation or tumbling granulation, for example. Usually a granulated powder with a mean particle size of several µm to 1000 µm will be used.

(3) Molding Step

The molding method is not particularly restricted so long as the molding powder can be molded into the desired shape. Examples include press molding, cast molding and injection molding. The molding pressure is not particularly restricted so long as it allows a manageable compact to be obtained without generating cracks. With a relatively high molding pressure, such as molding at 500 kg/cm² to 3.0 ton/cm² (49.0333 to 294.2 MPa) by press molding, for example, it is easy to obtain a sintered composite oxide 2 without aluminum oxide particles or titanium oxide particles, and with a relative density of 80% or greater. The molding density is preferably as high as possible. A method such as cold isostatic pressure (CIP) molding may be employed for this purpose. During the molding, a molding aid such as polyvinyl alcohol, an acrylic polymer, methyl cellulose, a wax or oleic acid may also be used.

(4) Firing Step

The obtained compact is then fired at 800° C. to 1500° C. Firing in this temperature range can yield a sintered composite oxide 2 comprising particles with a fine mean particle size. From the viewpoint of inhibiting the volatilization loss characteristic of zinc oxide-based composite oxides, and increasing the sintered density, the firing temperature is more preferably in the range of 900° C. to 1400° C. If the firing temperature is 900° C. to 1400° C., it will be easy to obtain a sintered composite oxide 2 without aluminum oxide particles or titanium oxide particles, and having a relative density of 80% or greater. Firing at a temperature of higher than 1500° C. will result in a notable increase in the mean particle size of the sintered composite oxide. Anomalous discharge during sputtering will therefore be notably increased when it is used as a sputtering target.

When a molding aid has been used during molding, it is preferred to add a degreasing step before firing, from the viewpoint of preventing damage such as cracking during heating.

According to this embodiment, a high sintered density is obtained by controlling the mean particle size of the particles composing the sintered composite oxide, as described above. It is thus possible to adequately inhibit anomalous discharge during sputtering, when it is used as a target.

There are no particular restrictions on the firing time, which will also depend on the firing temperature, but it will usually be 1 to 24 hours. It is preferably 3 to 12 hours. This is to ensure homogeneity in the sintered composite oxide 2. The homogeneity can be ensured even if the firing time is longer than 24 hours. However, a time of up to 24 hours is sufficient in consideration of the effect on productivity. With a long holding time of longer than 30 hours, in particular, the increase in the mean particle size of the sintered composite oxide becomes significant, and anomalous discharge tends to increase during sputtering when it is used as a target. In order to obtain a sintered composite oxide 2 comprising particles with an even finer mean particle size, the firing time is most preferably 3 to 12 hours.

The temperature-elevating rate is not particularly restricted, but for a temperature range of 800° C. or higher, it is preferably no greater than 50° C./hr. This is to ensure homogeneity of the sintered composite oxide 2.

The firing atmosphere is also not particularly restricted, and may be appropriately selected, for example, from among air, oxygen and inert gas atmospheres. The amount is more preferably a low oxygen concentration rather than air. This will facilitate introduction of oxygen defects into the sintered composite oxide 2, thereby lowering the resistivity of the sintered composite oxide and allowing anomalous discharge to be even further reduced. The pressure during firing is also not particularly restricted, and firing may be carried out at ordinary pressure or under pressure or reduced pressure. Firing can also be accomplished by hot isostatic pressing (HIP).

The (3) molding step and (4) firing step may be carried out simultaneously. That is, production may be by hot pressing in which the powder prepared in the (2) powder preparation step is packed into a molding die and fired, or a method of melting and injection of the same powder at high temperature into the prescribed shape.

(Sputtering Target)

The sputtering target of this embodiment comprises a sintered composite oxide 2. A transparent conductive oxide film formed by sputtering using such a sputtering target has low resistivity, excellent optical transparency not only in the visible region but also the infrared region, and excellent durability. Such a sputtering target also has excellent discharge properties during film formation, and reduced anomalous discharge allowing stable film formation.

According to this embodiment, the sintered composite oxide 2 may be used directly as a sputtering target, or the sintered composite oxide 2 may be worked into a prescribed shape for use as a sputtering target.

The surface roughness of the sputtering surface of the sputtering target is preferably no greater than 3 µm and more preferably no greater than 2 µm, as the center line average roughness (Ra). This can further inhibit the number of anomalous discharges during film formation, to allow stable film formation. The center line average roughness can be adjusted by a method of machining the sputtering surface of the sintered composite oxide using different number grinding stones, or a method of vapor blasting, such as sand blasting. Also, the center line average roughness can be determined by evaluating the measuring surface with a surface texture meter.

(Transparent Conductive Oxide Film)

The transparent conductive oxide film of this embodiment may be produced, for example, by sputtering using the aforementioned sputtering target.

The sputtering method for production of a transparent conductive oxide film for this embodiment may be appropriately selected from among DC sputtering, RF sputtering, AC sputtering, DC magnetron sputtering, RF magnetron sputtering and ion beam sputtering. Of these, DC magnetron sputtering and RF magnetron sputtering are preferred to allow high-speed film formation uniformly over large areas.

There are no particular restrictions on the temperature of the substrate to be used for sputtering, as it will depend on the heat resistance of the substrate. When the substrate is non-alkaline glass, for example, it is usually preferred to be no higher than 250° C., and it is usually preferred to be no higher than 150° C. when the substrate is a resin film. Naturally, film formation may be at a higher temperature when the substrate to be used is quartz, ceramic, metal or the like, which have excellent heat resistance.

The atmosphere gas for sputtering will usually be an inert gas, and argon gas, for example, may be used. If necessary, oxygen gas, nitrogen gas or hydrogen gas may be used.

Preferred embodiments of the invention were described above, but the invention is not limited to these embodiments. For example, the sintered composite oxide 2 was described as a disc shape, but it may instead have a different shape.

EXAMPLES

The invention will now be explained in greater detail with reference to examples and comparative examples, with the understanding that the invention is not limited thereto. The evaluation methods for the starting powders, sintered composite oxides, sputtering targets and transparent conductive oxide films are as follows.

[Starting Powder]

The physical properties of the starting powders used were as follows. The zinc oxide powder had a purity of 99.8 wt %, a BET specific surface area of 4 m$^2$/g and a mean particle size $D_{sz}$ of 2.4 µm. The aluminum oxide powder had a purity of 99.99 wt %, a BET specific surface area of 14 m$^2$/g and a mean particle size $D_{sa}$ of 1.6 µm. The titanium oxide powder had a purity of 99.9 wt %, a BET specific surface area of 6.5 m$^2$/g and a mean particle size $D_{st}$ of 2.2 µm.

(BET Specific Surface Area)

A MONOSORB (manufactured by U.S. Quantachrome) was used for measurement by the single-point BET method.

(Powder Mean Particle Size)

A COULTER LS130 (manufactured by Coulter Electronics) was used for measurement with a liquid module, in distilled water. The measured value is based on volume.

[Evaluation of Sintered Composite Oxide]

(Composition)

This was quantified by ICP luminescence analysis.

(Sintered Material Density)

The density of the sintered composite oxide was measured by Archimedes' method, according to JIS-R1634-1998. The relative density was calculated from the measured density and the theoretical density.

(Mean Particle Size)

The mean particle sizes of each of the particles in the sintered composite oxide were determined by the following procedure. After cutting the sintered composite oxide to an appropriate size, it was surface-polished. The polished surface was subjected to chemical etching using a dilute acetic acid solution, to render the grain boundaries distinct. The polished surface of the sample was photographed using an SEM and EPMA, and the composition of each of the particles was confirmed. Particles with a hexagonal wurtzite structure and particles with a $ZnTiO_3$-like structure and/or $Zn_2Ti_3O_8$-like structure were identified, the long diameters of 500 particles of each structure were measured and the arithmetic mean was calculated. This value was recorded as the mean particle size.

(X-Ray Diffraction Test)

The measuring conditions were as follows.
- X-ray source: CuKα
- Power: 40 kV, 40 mA
- Scanning rate: 1°/min The obtained diffraction pattern was analyzed, and classified as 1) a hexagonal wurtzite form structure phase, 2) a $ZnTiO_3$-like structure and/or $Zn_2Ti_3O_8$-like structure phase, 3) zinc aluminate ($ZnAl_2O_4$) spinel oxide structure phase, and 4) a crystal phase other than 1) to 3), such as an aluminum oxide phase or titanium oxide phase (listed as "other crystal phase" in the tables). A listing of "yes" indicated that a crystal phase of 1), 2), 3) or 4) was identified, and "no" indicates that no such crystal phase was identified.

[Sputtering Target Evaluation]

(Center Line Average Roughness)

The center line average roughness Ra was determined by evaluation using a surface texture meter (trade name: SV-3100 by Mitsutoyo Corp.), with the sputtering surface of the sputtering target as the measuring surface.

(Discharge Property)

The number of anomalous discharges produced per hour under the following sputtering conditions was calculated.

<Sputtering Conditions>
- Apparatus: DC magnetron sputtering apparatus (Ulvac, Inc.)
- Magnetic field intensity: 1000 Gauss (directly above target, horizontal component)
- Substrate temperature: Room temperature (approximately 25° C.)
- Ultimate vacuum: $5 \times 10^{-5}$ Pa
- Sputtering gas: argon
- Sputtering gas pressure: 0.5 Pa
- DC power: 300 W
- Sputtering time: 30 hours

[Transparent Conductive Oxide Film Evaluation]

(Transmittance)

The light transmittance of the integrated body of the substrate and transparent conductive oxide film formed thereover was measured using a U-4100 spectrophotometer (trade name of Hitachi, Ltd.), at a wavelength in the range of 240 nm to 2600 nm. The mean value of the transmittance at a wavelength of 400 nm to 800 nm was recorded as the transmittance in the visible region, and the mean value of the transmittance at a wavelength of 800 nm to 1200 nm was recorded as the transmittance in the infrared region. The transmittance of the transparent conductive oxide film was determined by the following formula.

((Transmittance of integrated body of substrate and transparent conductive oxide film)/(transmittance of substrate alone))×100(%)

(Resistance)

The resistance of the transparent conductive oxide film (sheet resistance) was measured using an HL5500 (trade name of Japan Bio-Rad Laboratories, Inc.).

(Durability)

A sample of the transparent conductive oxide film was exposed to an environment at a temperature of 85° C. and a relative humidity of 85% for 1000 consecutive hours, and the change in resistivity was observed. Defining the resistivity before and after the test as A and B respectively, the value of (B−A)/A in % units was recorded as the index of durability (reliability). In most cases, this value tends to increase as the test time progresses. A smaller value indicates more excellent durability.

Example 1

Fabrication of Sintered Composite Oxide

The aluminum oxide powder and titanium oxide powder were mixed to the Al and Ti atomic ratio listed in Table 1 and blended with a dry ball mill, to obtain mixed powder (A). The mixed powder (A) was calcined in air at 1000° C. and pulverized to obtain mixed powder (B) having a mean particle size of no greater than 1 μm. To this mixed powder (B) there was further added the aforementioned zinc oxide powder to the Al, Ti and Zn atomic ratio listed in Table 1, and the mixture was blended with a wet bead mill and spray-dried to obtain mixed powder (C). The mean particle size of the mixed powder (C) was no greater than 1 μm. The obtained mixed powder (C) was subjected to die molding using a die with a diameter of 150 mm at 0.3 ton/cm² (29.42 MPa), and then CIP molding at 3.0 ton/cm² (294.2 MPa), to obtain a compact. The compact was fired under the following conditions to obtain a sintered composite oxide for Example 1.

(Firing Conditions)
- Temperature-elevating rate: 50° C./hr
- Firing temperature: 1200° C.
- Firing time: 3 hours
- Firing atmosphere: nitrogen
- Temperature-lowering rate: 100° C./hr (Evaluation of Sintered Composite Oxide)

The relative density of the sintered composite oxide was as shown in Table 1. The obtained sintered composite oxide was pulverized and the product phase was identified by an X-ray diffraction test. As a result, there was only detected a diffraction peak attributable to a zinc oxide-containing hexagonal wurtzite structure phase, and an aluminum- and titanium-containing $ZnTiO_3$-like structure and $Zn_2Ti_3O_8$-like structure phase. On the other hand, no diffraction peak was detected for an aluminum oxide phase, a titanium oxide phase or a spinel oxide phase of zinc aluminate with zinc and aluminum in solid solution.

The polished surface of the sintered composite oxide was also analyzed by SEM and EPMA. As a result, it was confirmed that aluminum and titanium form compounds with zinc and exist as particles with a $ZnTiO_3$-like structure and a $Zn_2Ti_3O_8$-like structure. Furthermore, it was confirmed that the particles coexist with particles in a hexagonal wurtzite structure phase. The mean particle sizes of the particles were determined by the method described above. The evaluation results for the sintered composite oxide of Example 1 are shown in Table 1.

(Fabrication and Evaluation of Sputtering Target, and Fabrication of Transparent Conductive Oxide Film)

The sintered composite oxide of Example 1 was worked into a 4-inch φ size to obtain a sputtering target. One side of the sputtering target had its center line average roughness adjusted using a surface grinding machine and a diamond grinding stone, changing the number of the grinding stone, to prepare a sputtering surface. The center line average roughness of the sputtering surface was as shown in Table 3. The number of anomalous discharges produced per hour during sputtering is listed as "discharge property" in Table 3.

The obtained sputtering target was used for film formation by DC magnetron sputtering under the following conditions, to obtain a transparent conductive oxide film for Example 1.
(Sputtering Film Formation Conditions)
  Apparatus: DC magnetron sputtering apparatus
  Magnetic field intensity: 1000 Gauss (directly above target, horizontal component)
  Substrate temperature: 200° C.
  Ultimate vacuum: $5 \times 10^{-5}$ Pa
  Sputtering gas: argon
  Sputtering gas pressure: 0.5 Pa
  DC power: 300 W
  Film thickness: 1000 nm
  Substrate used: Non-alkaline glass (#1737 glass by Corning, Inc., thickness: 0.7 mm)

The number of anomalous discharges produced per hour during sputtering is listed as "discharge property" in Table 3. The resistance, transmittance and durability of the transparent conductive oxide film of Example 1 are shown in Table 3.
(Evaluation of Transparent Conductive Oxide Film)

The generated phase of the transparent conductive oxide film of Example 1 was measured by the same method as the X-ray diffraction test for the sintered composite oxide. As a result, the transparent conductive oxide film was found to be composed entirely of a hexagonal wurtzite structure phase.

Examples 2 to 36

Compacts were obtained for Examples 2 to 36 in the same manner as Example 1, except that the mixing proportions of the aluminum oxide powder and titanium oxide powder for obtaining mixed powder (A) were the atomic ratios listed in Table 1, and the mixing proportions of mixed powder (B) and zinc oxide powder for obtaining mixed powder (C) were the atomic ratios listed in Table 1. The compact was fired under the conditions shown in Table 2, to obtain sintered composite oxides for Examples 2 to 36.

The sintered composite oxides of Examples 2 to 36 were evaluated in the same manner as Example 1. As a result, for each of the sintered composite oxides of Examples 2 to 36, there were detected only diffraction peaks attributable to a zinc oxide-containing hexagonal wurtzite structure phase, and an aluminum- and titanium-containing $ZnTiO_3$-like structure and $Zn_2Ti_3O_8$-like structure phase. On the other hand, no diffraction peak was detected for an aluminum oxide phase, a titanium oxide phase and a spinel oxide phase of zinc aluminate with zinc and aluminum in solid solution.

The polished surfaces of the sintered composite oxides of Examples 2 to 36 were also analyzed by SEM and EPMA. As a result, it was confirmed that aluminum and titanium form compounds with zinc and exist as particles with a $ZnTiO_3$-like structure and a $Zn_2Ti_3O_8$-like structure. Furthermore, it was confirmed that the particles coexist with particles in a hexagonal wurtzite structure phase. The mean particle sizes of the particles were determined by the method described above. The evaluation results for the sintered composite oxides of Examples 2 to 36 are shown in Table 1.

Sputtering targets for Examples 2 to 36 were fabricated and evaluated in the same manner as Example 1. The number of anomalous discharges produced per hour during sputtering is listed as "discharge property" in Table 3.

The sputtering targets of Examples 2 to 36 were each used in the same manner as Example 1 to form films by DC magnetron sputtering, to obtain transparent conductive oxide films for Examples 2 to 36. The sputtering film formation conditions were the same as in Example 1.

The resistance, transmittance and durability of the transparent conductive oxide films of Examples 2 to 36 are shown in Table 3.

The generated phases of the transparent conductive oxide films of Examples 2 to 36 were measured in the same manner as Example 1. As a result, the transparent conductive oxide films of Examples 2 to 36 were all found to be composed entirely of a hexagonal wurtzite structure phase.

TABLE 1

| | Final composition of powder and sintered composition (atomic ratio) | | | Sintered composite oxide properties | | | | | | | |
|---|---|---|---|---|---|---|---|---|---|---|---|
| | | | | Mean particle size (μm) | | Crystal phase (X-ray diffraction test) | | | | | Relative density (%) |
| | $(Al + Ti)/(Zn + Al + Ti)$ | $Al/(Zn + Al + Ti)$ | $Ti/(Zn + Al + Ti)$ | Particles (A) | Particles (B) | (1) | (2) | $Ax/(Ax + Ay)$ | (3) | (4) | |
| Example 1  | 0.006 | 0.003 | 0.003 | 15.4 | 2.0 | yes | yes | 0.18 | no | no | 98.4 |
| Example 2  | 0.013 | 0.010 | 0.003 | 11.2 | 1.8 | yes | yes | 0.22 | no | no | 99.1 |
| Example 3  | 0.023 | 0.020 | 0.003 | 5.8  | 0.6 | yes | yes | 0.20 | no | no | 99.5 |
| Example 4  | 0.028 | 0.025 | 0.003 | 5.8  | 0.7 | yes | yes | 0.18 | no | no | 99.5 |
| Example 5  | 0.013 | 0.003 | 0.010 | 8.3  | 0.9 | yes | yes | 0.24 | no | no | 99.4 |
| Example 6  | 0.018 | 0.008 | 0.010 | 5.6  | 0.7 | yes | yes | 0.45 | no | no | 99.3 |
| Example 7  | 0.030 | 0.020 | 0.010 | 6.1  | 0.5 | yes | yes | 0.35 | no | no | 99.8 |
| Example 8  | 0.035 | 0.025 | 0.010 | 6.3  | 0.7 | yes | yes | 0.45 | no | no | 99.7 |
| Example 9  | 0.021 | 0.003 | 0.018 | 5.3  | 1.0 | yes | yes | 0.54 | no | no | 99.5 |
| Example 10 | 0.025 | 0.007 | 0.018 | 7.2  | 1.7 | yes | yes | 0.61 | no | no | 99.6 |
| Example 11 | 0.043 | 0.025 | 0.018 | 5.5  | 1.0 | yes | yes | 0.50 | no | no | 99.6 |
| Example 12 | 0.028 | 0.003 | 0.025 | 6.4  | 1.3 | yes | yes | 0.57 | no | no | 99.3 |
| Example 13 | 0.035 | 0.010 | 0.025 | 5.8  | 1.1 | yes | yes | 0.68 | no | no | 99.2 |
| Example 14 | 0.050 | 0.025 | 0.025 | 8.0  | 1.8 | yes | yes | 0.47 | no | no | 99.7 |
| Example 15 | 0.041 | 0.003 | 0.038 | 6.4  | 2.4 | yes | yes | 0.64 | no | no | 99.8 |
| Example 16 | 0.048 | 0.010 | 0.038 | 7.3  | 1.8 | yes | yes | 0.66 | no | no | 99.5 |
| Example 17 | 0.050 | 0.003 | 0.047 | 6.7  | 1.4 | yes | yes | 0.66 | no | no | 99.6 |
| Example 18 | 0.013 | 0.010 | 0.003 | 18.6 | 4.7 | yes | yes | 0.24 | no | no | 99.2 |
| Example 19 | 0.013 | 0.010 | 0.003 | 14.0 | 4.0 | yes | yes | 0.24 | no | no | 99.4 |
| Example 20 | 0.013 | 0.010 | 0.003 | 11.8 | 2.0 | yes | yes | 0.18 | no | no | 99.2 |

TABLE 1-continued

| | Final composition of powder and sintered composition (atomic ratio) | | | Sintered composite oxide properties | | | | | | | |
|---|---|---|---|---|---|---|---|---|---|---|---|
| | | | | Mean particle size (μm) | | Crystal phase (X-ray diffraction test) | | | | | Relative |
| | (Al + Ti)/ (Zn + Al + Ti) | Al/ (Zn + Al + Ti) | Ti/ (Zn + Al + Ti) | Particles (A) | Particles (B) | (1) | (2) | Ax/ (Ax + Ay) | (3) | (4) | density (%) |
| Example 21 | 0.013 | 0.010 | 0.003 | 6.6 | 0.6 | yes | yes | 0.17 | no | no | 98.0 |
| Example 22 | 0.013 | 0.010 | 0.003 | 12.5 | 2.2 | yes | yes | 0.22 | no | no | 99.3 |
| Example 23 | 0.013 | 0.010 | 0.003 | 15.0 | 3.5 | yes | yes | 0.26 | no | no | 99.2 |
| Example 24 | 0.013 | 0.010 | 0.003 | 11.4 | 2.1 | yes | yes | 0.22 | no | no | 99.2 |
| Example 25 | 0.013 | 0.010 | 0.003 | 11.9 | 2.0 | yes | yes | 0.20 | no | no | 99.3 |
| Example 26 | 0.018 | 0.008 | 0.010 | 10.8 | 3.0 | yes | yes | 0.50 | no | no | 99.2 |
| Example 27 | 0.018 | 0.008 | 0.010 | 9.2 | 2.6 | yes | yes | 0.46 | no | no | 99.4 |
| Example 28 | 0.018 | 0.008 | 0.010 | 6.0 | 1.8 | yes | yes | 0.44 | no | no | 99.4 |
| Example 29 | 0.018 | 0.008 | 0.010 | 5.8 | 0.6 | yes | yes | 0.40 | no | no | 98.3 |
| Example 30 | 0.018 | 0.008 | 0.010 | 7.3 | 2.1 | yes | yes | 0.45 | no | no | 99.5 |
| Example 31 | 0.018 | 0.008 | 0.010 | 8.6 | 2.3 | yes | yes | 0.47 | no | no | 99.4 |
| Example 32 | 0.018 | 0.008 | 0.010 | 7.4 | 1.6 | yes | yes | 0.48 | no | no | 99.1 |
| Example 33 | 0.018 | 0.008 | 0.010 | 6.0 | 1.8 | yes | yes | 0.44 | no | no | 99.1 |
| Example 34 | 0.013 | 0.010 | 0.003 | 11.2 | 1.8 | yes | yes | 0.22 | no | no | 99.1 |
| Example 35 | 0.013 | 0.010 | 0.003 | 11.2 | 1.8 | yes | yes | 0.22 | no | no | 99.1 |
| Example 36 | 0.013 | 0.010 | 0.003 | 11.2 | 1.8 | yes | yes | 0.22 | no | no | 99.1 |
| Example 37 | 0.018 | 0.008 | 0.010 | 5.6 | 0.7 | yes | yes | 0.45 | no | no | 99.3 |
| Example 38 | 0.018 | 0.008 | 0.010 | 5.6 | 0.7 | yes | yes | 0.45 | no | no | 99.3 |
| Example 39 | 0.018 | 0.008 | 0.010 | 5.6 | 0.7 | yes | yes | 0.45 | no | no | 99.3 |

In Table, Particles (A) represent the particles having a hexagonal wurtzite structure, and Particles (B) represent the particles having a $ZnTiO_3$-like structure and $Zn_2Ti_3O_8$-like structure. In Crystal phase in Table, 1) represents a hexagonal wurtzite form structure phase, 2) represents a $ZnTiO_3$-like structure and $Zn_2Ti_3O_8$-like structure phase, 3) represents a zinc aluminate ($ZnAl_2O_4$) spinel oxide structure phase, and 4) represents a crystal phase other than 1) to 3), such as an aluminum oxide phase or titanium oxide phase.

TABLE 2

| | Firing conditions | | | | |
|---|---|---|---|---|---|
| | Temperature-elevating rate (° C./hr) | Firing temperature (° C.) | Firing time (hr) | Firing atmosphere | Temperature-lowering rate (° C./hr) |
| Example 1 | 50 | 1200 | 3 | Nitrogen | 100 |
| Example 2 | 50 | 1200 | 3 | Nitrogen | 100 |
| Example 3 | 50 | 1200 | 3 | Nitrogen | 100 |
| Example 4 | 50 | 1200 | 3 | Nitrogen | 100 |
| Example 5 | 50 | 1200 | 3 | Nitrogen | 100 |
| Example 6 | 50 | 1200 | 3 | Nitrogen | 100 |
| Example 7 | 50 | 1200 | 3 | Nitrogen | 100 |
| Example 8 | 50 | 1200 | 3 | Nitrogen | 100 |
| Example 9 | 50 | 1200 | 3 | Nitrogen | 100 |
| Example 10 | 50 | 1200 | 3 | Nitrogen | 100 |
| Example 11 | 50 | 1200 | 3 | Nitrogen | 100 |
| Example 12 | 50 | 1200 | 3 | Nitrogen | 100 |
| Example 13 | 50 | 1200 | 3 | Nitrogen | 100 |
| Example 14 | 50 | 1200 | 3 | Nitrogen | 100 |
| Example 15 | 50 | 1200 | 3 | Nitrogen | 100 |
| Example 16 | 50 | 1200 | 3 | Nitrogen | 100 |
| Example 17 | 50 | 1200 | 3 | Nitrogen | 100 |
| Example 18 | 50 | 1500 | 3 | Nitrogen | 100 |
| Example 19 | 50 | 1400 | 3 | Nitrogen | 100 |
| Example 20 | 50 | 1100 | 3 | Nitrogen | 100 |
| Example 21 | 50 | 900 | 3 | Nitrogen | 100 |
| Example 22 | 50 | 1200 | 5 | Nitrogen | 100 |
| Example 23 | 50 | 1200 | 10 | Nitrogen | 100 |
| Example 24 | 50 | 1200 | 3 | Air | 100 |
| Example 25 | 50 | 1100 | 3 | Air | 100 |
| Example 26 | 50 | 1500 | 3 | Nitrogen | 100 |
| Example 27 | 50 | 1400 | 3 | Nitrogen | 100 |
| Example 28 | 50 | 1100 | 3 | Nitrogen | 100 |
| Example 29 | 50 | 900 | 3 | Nitrogen | 100 |
| Example 30 | 50 | 1200 | 5 | Nitrogen | 100 |
| Example 31 | 50 | 1200 | 10 | Nitrogen | 100 |
| Example 32 | 50 | 1200 | 3 | Air | 100 |
| Example 33 | 50 | 1100 | 3 | Air | 100 |
| Example 34 | 50 | 1200 | 3 | Nitrogen | 100 |
| Example 35 | 50 | 1200 | 3 | Nitrogen | 100 |
| Example 36 | 50 | 1200 | 3 | Nitrogen | 100 |
| Example 37 | 50 | 1200 | 3 | Nitrogen | 100 |
| Example 38 | 50 | 1200 | 3 | Nitrogen | 100 |
| Example 39 | 50 | 1200 | 3 | Nitrogen | 100 |

TABLE 3

|  | Target properties | | Properties of transparent conductive oxide film | | | |
|---|---|---|---|---|---|---|
|  | Center line average roughness (μm) | Discharge property (times/hr) | Sheet resistance (Ω/□) | Transmittance (%) | | Durability (%) |
|  | | | | Visible region (400-800 nm) | Infrared region (800-1200 nm) | |
| Example 1 | 0.55 | 11.6 | 18.9 | 88.1 | 92.8 | 25.1 |
| Example 2 | 0.49 | 10.7 | 12.1 | 89.0 | 90.1 | 22.2 |
| Example 3 | 0.41 | 11.0 | 7.4 | 88.4 | 84.0 | 15.3 |
| Example 4 | 0.48 | 11.3 | 5.1 | 87.2 | 81.7 | 12.2 |
| Example 5 | 0.37 | 6.2 | 8.3 | 88.0 | 90.3 | 6.2 |
| Example 6 | 0.35 | 6.6 | 8.0 | 89.5 | 85.8 | 3.4 |
| Example 7 | 0.48 | 9.5 | 8.5 | 89.8 | 80.2 | 2.2 |
| Example 8 | 0.42 | 9.2 | 9.3 | 89.3 | 81.4 | 1.8 |
| Example 9 | 0.35 | 7.8 | 9.8 | 87.7 | 94.3 | 2.2 |
| Example 10 | 0.45 | 12.2 | 13.1 | 88.4 | 86.8 | 2.4 |
| Example 11 | 0.40 | 11.4 | 7.5 | 87.9 | 82.7 | 1.6 |
| Example 12 | 0.40 | 7.3 | 17.6 | 87.8 | 89.1 | 2.0 |
| Example 13 | 0.42 | 8.5 | 15.2 | 89.2 | 83.0 | 2.5 |
| Example 14 | 0.38 | 7.1 | 17.8 | 88.7 | 82.6 | 2.3 |
| Example 15 | 0.41 | 6.4 | 26.2 | 87.2 | 87.7 | 2.6 |
| Example 16 | 0.41 | 8.7 | 22.1 | 88.0 | 85.3 | 2.2 |
| Example 17 | 0.47 | 5.1 | 16.4 | 86.9 | 85.1 | 2.0 |
| Example 18 | 0.41 | 13.3 | 12.1 | 88.8 | 90.0 | 22.2 |
| Example 19 | 0.41 | 11.5 | 11.9 | 88.8 | 89.9 | 21.6 |
| Example 20 | 0.53 | 10.3 | 12.2 | 89.0 | 90.3 | 21.7 |
| Example 21 | 0.48 | 13.4 | 12.0 | 88.6 | 90.1 | 21.8 |
| Example 22 | 0.51 | 10.4 | 12.1 | 89.2 | 90.1 | 22.4 |
| Example 23 | 0.44 | 11.0 | 12.1 | 88.9 | 89.8 | 22.2 |
| Example 24 | 0.46 | 10.9 | 12.0 | 89.0 | 90.1 | 22.0 |
| Example 25 | 0.43 | 10.6 | 11.8 | 88.9 | 90.0 | 22.4 |
| Example 26 | 0.37 | 8.9 | 13.0 | 89.4 | 85.6 | 3.4 |
| Example 27 | 0.40 | 8.3 | 13.1 | 89.4 | 85.8 | 3.1 |
| Example 28 | 0.35 | 6.2 | 13.1 | 89.7 | 85.8 | 3.8 |
| Example 29 | 0.38 | 9.2 | 13.0 | 89.5 | 86.0 | 3.5 |
| Example 30 | 0.42 | 7.8 | 12.8 | 89.3 | 86.0 | 3.5 |
| Example 31 | 0.46 | 8.5 | 13.2 | 89.8 | 85.8 | 3.3 |
| Example 32 | 0.35 | 6.9 | 13.0 | 89.3 | 85.7 | 3.4 |
| Example 33 | 0.42 | 6.8 | 12.8 | 89.5 | 85.9 | 3.2 |
| Example 34 | 1.85 | 11.6 | 11.9 | 89.2 | 90.0 | 21.8 |
| Example 35 | 2.73 | 13.1 | 12.1 | 89.0 | 90.0 | 22.2 |
| Example 36 | 3.14 | 18.8 | 12.0 | 88.7 | 90.1 | 22.1 |
| Example 37 | 1.73 | 9.7 | 13.3 | 89.6 | 86.0 | 3.3 |
| Example 38 | 2.88 | 10.9 | 13.1 | 89.2 | 85.8 | 3.4 |
| Example 39 | 3.16 | 15.2 | 13.4 | 89.5 | 85.8 | 3.4 |

Comparative Example 1

Fabrication of Sintered Composite Oxide

The zinc oxide powder was pulverized with a dry ball mill to a mean particle size of no greater than 1 μm. The powder was subjected to die molding using a die with a diameter of 150 mm at 0.3 ton/cm² (29.42 MPa), and then CIP molding at 3.0 ton/cm² (294.2 MPa), to obtain a compact. The compact was fired under the conditions shown in Table 5, to obtain a sintered composite oxide for Comparative Example 1.

The sintered composite oxide of Comparative Example 1 was evaluated in the same manner as Example 1. As a result, in the sintered composite oxide of Comparative Example 1, there was detected only a diffraction peak attributable to a zinc oxide-containing hexagonal wurtzite structure phase. The mean particle size of the particles of the sintered composite oxide was determined in the same manner as Example 1. The evaluation results for the sintered composite oxide of Comparative Example 1 are shown in Table 4.

A sputtering target for Comparative Example 1 was fabricated and evaluated in the same manner as Example 1. The number of anomalous discharges produced per hour during sputtering is listed as "discharge property" in Table 6.

The sputtering target of Comparative Example 1 was used in the same manner as Example 1 to form a film by DC magnetron sputtering, to obtain a transparent conductive oxide film for Comparative Example 1. The sputtering film formation conditions were the same as in Example 1. The resistance, transmittance and durability of the transparent conductive oxide film of Comparative Example 1 are shown in Table 6.

The generated phase of the transparent conductive oxide film of Comparative Example 1 was measured in the same manner as Example 1. As a result, the transparent conductive oxide film of Comparative Example 1 was found to be composed entirely of a hexagonal wurtzite structure phase.

Comparative Examples 2 to 5

The aforementioned aluminum oxide powder and zinc oxide powder were combined with the Al and Zn atomic ratios of Comparative Examples 2 to 5 in Table 4, blended with a wet bead mill, and spray-dried. The mean particle size was no greater than 1 μm. The obtained powder was subjected to die molding using a die with a diameter of 150 mm at 0.3 ton/cm² (29.42 MPa), and then CIP molding at 3.0 ton/cm² (294.2 MPa), to obtain a compact. The compact was fired under the conditions shown in Table 5, to obtain sintered composite oxides for Comparative Examples 2 to 5.

The sintered composite oxides of Comparative Examples 2 to 5 were evaluated in the same manner as Example 1. As a result, in the sintered composite oxides of Comparative Examples 2 to 5, there were detected only diffraction peaks attributable to a zinc oxide-containing hexagonal wurtzite structure phase, and a spinel oxide phase of zinc aluminate with zinc and aluminum in solid solution. However, no diffraction peak attributable to an aluminum oxide phase was detected. The evaluation results for the sintered composite oxides of Comparative Examples 2 to 5 are shown in Table 4.

Sputtering targets for Comparative Examples 2 to 5 were fabricated and evaluated in the same manner as Example 1. The number of anomalous discharges produced per hour during sputtering is listed as "discharge property" in Table 6.

The sputtering targets of Comparative Examples 2 to 5 were each used in the same manner as Example 1 to form films by DC magnetron sputtering, to obtain transparent conductive oxide films for Comparative Examples 2 to 5. The sputtering film formation conditions were the same as in Example 1. The resistance, transmittance and durability of the transparent conductive oxide films of Comparative Examples 2 to 5 are shown in Table 6.

The generated phases of the transparent conductive oxide films of Comparative Examples 2 to 5 were measured in the same manner as Example 1. As a result, the transparent conductive oxide films of Comparative Examples 2 to 5 were all found to be composed entirely of a hexagonal wurtzite structure phase.

Comparative Example 6

The aforementioned titanium oxide powder and zinc oxide powder were combined with the Ti and Zn atomic ratio of Comparative Example 6 in Table 4, blended with a wet bead mill, and spray-dried. The mean particle size was no greater than 1 μm. The obtained powder was subjected to die molding using a die with a diameter of 150 mm at 0.3 ton/cm$^2$ (29.42 MPa), and then CIP molding at 3.0 ton/cm$^2$ (294.2 MPa), to obtain a compact. The compact was fired under the conditions shown in Table 5, to obtain a sintered composite oxide for Comparative Example 6.

The sintered composite oxide of Comparative Example 6 was evaluated in the same manner as Example 1. As a result, for the sintered composite oxide of Comparative Example 6, there were detected only diffraction peaks attributable to a zinc oxide-containing hexagonal wurtzite structure phase, and a titanium-containing $ZnTiO_3$-like structure and $Zn_2Ti_3O_8$-like structure phase. However, no diffraction peak attributable to a titanium oxide phase was detected.

Also, the polished surface of the sintered composite oxide of Comparative Example 6 was analyzed by SEM and EPMA, and the mean particle sizes of the $ZnTiO_3$-like structured and $Zn_2Ti_3O_8$-like structured particles and the hexagonal wurtzite structure phase particles were determined in the same manner as Example 1. The evaluation results for the sintered composite oxide of Comparative Example 6 are shown in Table 4.

A sputtering target for Comparative Example 6 was fabricated and evaluated in the same manner as Example 1. The number of anomalous discharges produced per hour during sputtering is listed as "discharge property" in Table 6.

The sputtering target of Comparative Example 6 was used in the same manner as Example 1 to form a film by DC magnetron sputtering, to obtain a transparent conductive oxide film for Comparative Example 6. The sputtering film formation conditions were the same as in Example 1.

The resistance, transmittance and durability of the transparent conductive oxide film of Comparative Example 6 are shown in Table 6.

The generated phase of the transparent conductive oxide film of Comparative Example 6 was measured in the same manner as Example 1. As a result, the transparent conductive oxide film of Comparative Example 6 was found to be composed entirely of a hexagonal wurtzite structure phase.

Comparative Examples 7, 9, 10 and 12-21

Compacts were obtained for Comparative Examples 7, 9, 10 and 12-21 in the same manner as Example 1, except that the mixing proportions of the aluminum oxide powder and titanium oxide powder for obtaining mixed powder (A) were the atomic ratios listed in Table 4, and the mixing proportions of mixed powder (B) and zinc oxide powder for obtaining mixed powder (C) were the atomic ratios listed in Table 4. Each compact was fired under the conditions shown in Table 5, to obtain sintered composite oxides for Comparative Examples 7, 9, 10 and 12-21.

The sintered composite oxides were evaluated in the same manner as Example 1. As a result, for each of the sintered composite oxides of Comparative Examples 7, 9, 10, 12-15, 17, 18, 20 and 21, there were detected only diffraction peaks attributable to a zinc oxide-containing hexagonal wurtzite structure phase, and an aluminum- and titanium-containing $ZnTiO_3$-like structure and $Zn_2Ti_3O_8$-like structure phase. On the other hand, no diffraction peak was detected for an aluminum oxide phase, a titanium oxide phase or a spinel oxide phase of zinc aluminate with zinc and aluminum in solid solution.

The polished surfaces of the sintered composite oxides of Comparative Examples 7, 9, 10, 12-15, 17, 18, 20 and 21 were also analyzed by SEM and EPMA. As a result, it was confirmed that aluminum and titanium form compounds with zinc and exist as particles with a $ZnTiO_3$-like structure and a $Zn_2Ti_3O_8$-like structure. Furthermore, it was confirmed that the particles coexist with particles in a hexagonal wurtzite structure phase. The mean particle sizes of each of the particles were determined in the same manner as Example 1.

In contrast, for each of the sintered composite oxides of Comparative Examples 16 and 19, there were detected diffraction peaks attributable to a zinc oxide-containing hexagonal wurtzite structure phase, and an aluminum- and titanium-containing $ZnTiO_3$-like structure and $Zn_2Ti_3O_8$-like structure phase, as well as trace diffraction peaks attributable to an aluminum oxide phase, a titanium oxide phase and a spinel oxide phase of zinc aluminate with zinc and aluminum in solid solution. The polished surfaces of the sintered composite oxides were analyzed by SEM and EPMA, in the same manner as Example 1. The mean particle sizes of the particles were also determined in the same manner as Example 1.

The evaluation results for the sintered composite oxides of Comparative Examples 7, 9, 10 and 12-21 are shown in Table 4. Sputtering targets were fabricated and evaluated for these comparative examples, in the same manner as Example 1. The number of anomalous discharges produced per hour during sputtering is listed as "discharge property" in Table 6.

The sputtering targets of the comparative examples were each used in the same manner as Example 1 to form films by DC magnetron sputtering, to obtain transparent conductive oxide films. The sputtering film formation conditions were the same as in Example 1. The resistance, transmittance and durability of the transparent conductive oxide films of Comparative Examples 7, 9, 10 and 12 to 21 were as shown in Table 6.

The generated phases of the transparent conductive oxide films of Comparative Examples 7, 9, 10 and 12-21 were measured in the same manner as Example 1. As a result, the transparent conductive oxide films of Comparative Examples 7, 9, 10 and 12-21 were all found to be composed entirely of a hexagonal wurtzite structure phase.

Comparative Examples 8 and 11

The aforementioned titanium oxide powder and zinc oxide powder were combined with the Ti and Zn atomic ratios of Comparative Examples 8 and 11 in Table 4, blended with a wet bead mill, and spray-dried. The mean particle size was no greater than 1 μm. The obtained powder was subjected to die molding using a die with a diameter of 150 mm at 0.3 ton/cm$^2$ (29.42 MPa), and then CIP molding at 3.0 ton/cm$^2$ (294.2 MPa), to obtain a compact. Each compact was fired under the conditions shown in Table 5, to obtain sintered composite oxides for Comparative Examples 8 and 11.

The sintered composite oxides of Comparative Examples 8 and 11 were evaluated in the same manner as Example 1. As a result, for the sintered composite oxides of Comparative Examples 8 and 11, there were detected only diffraction peaks attributable to a zinc oxide-containing hexagonal wurtzite structure phase, and a titanium-containing $ZnTiO_3$-like structure and $Zn_2Ti_3O_8$-like structure phase. However, no diffraction peak attributable to a titanium oxide phase was detected.

Also, the polished surfaces of the sintered composite oxides of Comparative Examples 8 and 11 were analyzed by SEM and EPMA, and the mean particle sizes of the $ZnTiO_3$-like structured and $Zn_2Ti_3O_8$-like structured particles and the hexagonal wurtzite structure phase particles were determined in the same manner as Example 1. The evaluation results for the sintered composite oxides of Comparative Examples 8 and 11 are shown in Table 4.

Sputtering targets for Comparative Examples 8 and 11 were fabricated and evaluated in the same manner as Example 1. The number of anomalous discharges produced per hour during sputtering is listed as "discharge property" in Table 6.

The sputtering targets of Comparative Examples 8 and 11 were used in the same manner as Example 1 to form films by DC magnetron sputtering, to obtain transparent conductive oxide films for Comparative Examples 8 and 11. The sputtering film formation conditions were the same as in Example 1. The resistance, transmittance and durability of the transparent conductive oxide films of Comparative Examples 8 and 11 are shown in Table 6.

The generated phases of the transparent conductive oxide films of Comparative Examples 8 and 11 were measured in the same manner as Example 1. As a result, the transparent conductive oxide films of Comparative Examples 8 and 11 were both found to be composed entirely of a hexagonal wurtzite structure phase.

Comparative Examples 22 to 24

The aforementioned zinc oxide powder, aluminum oxide powder and titanium oxide powder were combined with the Zn, Al and Ti atomic ratios of Comparative Examples 22 to 24 in Table 4, and blended with a wet ball mill. Polyvinyl alcohol was added to 1 wt % with respect to the total solid weight of the starting powder. After spray-drying, the obtained powder was subjected to CIP molding at 3.0 ton/cm$^2$ (294.2 MPa), and degreased in air at 500° C. to obtain a compact. The compact was fired under the conditions shown in Table 5, to obtain sintered composite oxides for Comparative Examples 22 to 24.

The sintered composite oxides of Comparative Examples 22 to 24 were evaluated in the same manner as Example 1. As a result, for each of the sintered composite oxides of Comparative Examples 22 to 24, there were detected only diffraction peaks attributable to a zinc oxide-containing hexagonal wurtzite structure phase, and an aluminum- and titanium-containing $ZnTiO_3$-like structure and $Zn_2Ti_3O_8$-like structure phase. On the other hand, no diffraction peak was detected for an aluminum oxide phase, a titanium oxide phase or a spinel oxide phase of zinc aluminate with zinc and aluminum in solid solution.

The polished surfaces of the sintered composite oxides of Comparative Examples 22 to 24 were also analyzed by SEM and EPMA. As a result, it was confirmed that aluminum and titanium form compounds with zinc and exist as particles with a $ZnTiO_3$-like structure and a $Zn_2Ti_3O_8$-like structure. Furthermore, it was confirmed that the particles coexist with particles in a hexagonal wurtzite structure phase. The mean particle sizes of each of the particles were determined by the same method as Example 1. The evaluation results for the sintered composite oxides of Comparative Examples 22 to 24 are shown in Table 4.

Sputtering targets for Comparative Examples 22 to 24 were fabricated and evaluated in the same manner as Example 1. The number of anomalous discharges produced per hour during sputtering is listed as "discharge property" in Table 6.

The sputtering targets of Comparative Examples 22 to 24 were each used in the same manner as Example 1 to form films by DC magnetron sputtering, to obtain transparent conductive oxide films for Comparative Examples 22 to 24. The sputtering film formation conditions for Comparative Example 23 were as follows. However, the sputtering film formation conditions for Comparative Examples 22 and 24 were the same as Example 1.

(Sputtering Film Formation Conditions)
Apparatus: DC magnetron sputtering apparatus
Magnetic field intensity: 1000 Gauss (directly above target, horizontal component)
Substrate temperature: 25° C.
Ultimate vacuum: 5×10 Pa
Sputtering gas: argon
Sputtering gas pressure: 0.5 Pa
DC power: 300 W
Film thickness: 1000 nm
Substrate used: Non-alkaline glass (#1737 glass by Corning, Inc., thickness: 0.7 mm)

The resistance, transmittance and durability of the transparent conductive oxide films of Comparative Examples 22 to 24 are shown in Table 6.

The generated phases of the transparent conductive oxide films of Comparative Examples 22 to 24 were measured in the same manner as Example 1. As a result, the transparent conductive oxide films were all found to be composed entirely of a hexagonal wurtzite structure phase.

Comparative Example 25

The aluminum oxide powder and titanium oxide powder were weighed out to the Al and Ti atomic ratio listed in Table 4. The powders were mixed with zinc oxide in an equimolar amount as the total number of moles of aluminum oxide and titanium oxide, blended with a wet ball mill and dried to obtain a mixed powder. The mixed powder was calcined in air at 1000° C. to obtain a calcined powder. Zinc oxide powder was added to the calcined powder to the atomic ratios of Al, Ti and Zn listed in Table 4, and blended with a wet ball mill. Polyvinyl alcohol was added to 1 wt % with respect to the total solid weight of the starting powder. After spray-drying, the obtained powder was subjected to die molding using a die with a diameter of 150 mm at 0.3 ton/cm² (29.42 MPa), and then CIP molding at 3.0 ton/cm² (294.2 MPa) and degreasing in air at 500° C., to obtain a compact. The compact was fired under the conditions shown in Table 5, to fabricate a sintered composite oxide compact.

The sintered composite oxide of Comparative Example 25 was evaluated in the same manner as Example 1. As a result, for the sintered composite oxide of Comparative Example 25, there were observed diffraction peaks attributable to a zinc oxide-containing hexagonal wurtzite structure phase, an aluminum- and titanium-containing $ZnTiO_3$-like structure and $Zn_2Ti_3O_8$-like structure phase, and a spinel oxide phase of zinc aluminate with zinc and aluminum in solid solution. However, no diffraction peak attributable to an aluminum oxide phase or titanium oxide phase was detected. This confirmed the coexistence of a composite oxide phase of aluminum and zinc, and a composite oxide phase of titanium and zinc.

The mean particle sizes of the particles were also determined in the same manner as Example 1. The evaluation results for the sintered composite oxide of Comparative Example 25 are shown in Table 4.

A sputtering target for Comparative Example 25 was fabricated and evaluated in the same manner as Example 1. The number of anomalous discharges produced per hour during sputtering is listed as "discharge property" in Table 6.

The sputtering target of Comparative Example 25 was used in the same manner as Example 1 to form a film by DC magnetron sputtering, to obtain a transparent conductive oxide film for Comparative Example 25. The sputtering film formation conditions were the same as in Example 1. The resistance, transmittance and durability of the transparent conductive oxide film are shown in Table 6.

The generated phase of the transparent conductive oxide film was measured in the same manner as Example 1. As a result, the transparent conductive oxide film of Comparative Example 25 was found to be composed entirely of a hexagonal wurtzite structure phase.

Comparative Example 26

After mixing the aforementioned aluminum oxide powder and zinc oxide powder in equimolar amounts using a wet ball mill, the blend was dried to obtain mixed powder A. The mixed powder A was calcined in air at 1000° C. Next, the aforementioned titanium oxide powder and zinc oxide powder were mixed in equimolar amounts using a wet ball mill, and the blend was dried to obtain mixed powder B. The mixed powder B was calcined in air at 1000° C.

The calcined mixed powders A and B and zinc oxide powder were mixed with a wet ball mill to the Al, Ti and Zn composition listed in Table 6. Polyvinyl alcohol was added to 1 wt % with respect to the total solid weight of the starting powder. After spray-drying, the obtained powder was subjected to die molding using a die with a diameter of 150 mm at 0.3 ton/cm² (29.42 MPa), and then CIP molding at 3.0 ton/cm² (294.2 MPa) and degreasing in air at 500° C., to obtain a compact. The compact was fired under the conditions shown in Table 5, to fabricate a sintered composite oxide compact.

The sintered composite oxide of Comparative Example 26 was evaluated in the same manner as Example 1. As a result, for the sintered composite oxide of Comparative Example 26, there were observed diffraction peaks attributable to a zinc oxide-containing hexagonal wurtzite structure phase, an aluminum- and titanium-containing $ZnTiO_3$-like structure and $Zn_2Ti_3O_8$-like structure phase, and a spinel oxide phase of zinc aluminate with zinc and aluminum in solid solution. However, no diffraction peak attributable to an aluminum oxide phase or titanium oxide phase was detected. This confirmed the coexistence of a composite oxide phase of aluminum and zinc, and a composite oxide phase of titanium and zinc.

The mean particle sizes of the particles were also determined in the same manner as Example 1. The evaluation results for the sintered composite oxide of Comparative Example 26 are shown in Table 4.

A sputtering target for Comparative Example 26 was fabricated and evaluated in the same manner as Example 1. The number of anomalous discharges produced per hour during sputtering is listed as "discharge property" in Table 6.

The sputtering target of Comparative Example 26 was used in the same manner as Example 1 to form a film by DC magnetron sputtering, to obtain a transparent conductive oxide film for Comparative Example 26. The sputtering film formation conditions were the same as in Example 1. The resistance, transmittance and durability of the transparent conductive oxide film are shown in Table 6.

The generated phases of the transparent conductive oxide film were measured in the same manner as Example 1. As a result, the transparent conductive oxide film of Comparative Example 26 was found to be composed entirely of a hexagonal wurtzite structure phase.

TABLE 4

| | Final composition of powder and sintered composition (atomic ratio) | | | Sintered composite oxide properties | | | | | | | |
| --- | --- | --- | --- | --- | --- | --- | --- | --- | --- | --- | --- |
| | | | | Mean particle size (μm) | | Crystal phase (X-ray diffraction test) | | | | | Relative density (%) |
| | (Al + Ti)/ (Zn + Al + Ti) | Al/ (Zn + Al + Ti) | Ti/ (Zn + Al + Ti) | Particles (A) | Particles (B) | (1) | (2) | Ax/ (Ax + Ay) | (3) | (4) | |
| Comp. Ex. 1 | 0.000 | 0.000 | 0.000 | 19.4 | — | yes | no | — | no | no | 96.1 |
| Comp. Ex. 2 | 0.010 | 0.010 | 0.000 | 12.0 | — | yes | no | — | yes | no | 97.3 |
| Comp. Ex. 3 | 0.020 | 0.020 | 0.000 | 5.2 | — | yes | no | — | yes | no | 97.9 |
| Comp. Ex. 4 | 0.027 | 0.027 | 0.000 | 6.0 | — | yes | no | — | yes | no | 98.8 |
| Comp. Ex. 5 | 0.032 | 0.032 | 0.000 | 5.4 | — | yes | no | — | yes | no | 98.6 |
| Comp. Ex. 6 | 0.003 | 0.000 | 0.003 | 17.8 | 2.4 | yes | yes | 0.11 | no | no | 99.0 |
| Comp. Ex. 7 | 0.032 | 0.027 | 0.005 | 6.7 | 1.1 | yes | yes | 0.12 | no | no | 99.2 |
| Comp. Ex. 8 | 0.020 | 0.000 | 0.020 | 5.4 | 1.6 | yes | yes | 0.55 | no | no | 99.2 |
| Comp. Ex. 9 | 0.047 | 0.027 | 0.020 | 7.3 | 2.3 | yes | yes | 0.52 | no | no | 99.4 |
| Comp. Ex. 10 | 0.052 | 0.027 | 0.025 | 7.3 | 2.2 | yes | yes | 0.55 | no | no | 99.4 |
| Comp. Ex. 11 | 0.038 | 0.000 | 0.038 | 5.1 | 1.8 | yes | yes | 0.68 | no | no | 99.3 |
| Comp. Ex. 12 | 0.058 | 0.020 | 0.038 | 5.9 | 0.6 | yes | yes | 0.51 | no | no | 99.4 |

TABLE 4-continued

| | Final composition of powder and sintered composition (atomic ratio) | | | Sintered composite oxide properties | | | | | | | |
|---|---|---|---|---|---|---|---|---|---|---|---|
| | | | | Mean particle size (μm) | | Crystal phase (X-ray diffraction test) | | | | | Relative density (%) |
| | (Al + Ti)/ (Zn + Al + Ti) | Al/ (Zn + Al + Ti) | Ti/ (Zn + Al + Ti) | Particles (A) | Particles (B) | (1) | (2) | Ax/ (Ax + Ay) | (3) | (4) | |
| Comp. Ex. 13 | 0.057 | 0.010 | 0.047 | 3.8 | 0.4 | yes | yes | 0.70 | no | no | 99.4 |
| Comp. Ex. 14 | 0.058 | 0.003 | 0.055 | 9.2 | 0.7 | yes | yes | 0.68 | no | no | 99.5 |
| Comp. Ex. 15 | 0.013 | 0.010 | 0.003 | 28.5 | 8.8 | yes | yes | 0.31 | no | no | 99.4 |
| Comp. Ex. 16 | 0.013 | 0.010 | 0.003 | 6.8 | 0.6 | yes | yes | 0.24 | yes | yes | 86.2 |
| Comp. Ex. 17 | 0.013 | 0.010 | 0.003 | 22.7 | 6.2 | yes | yes | 0.26 | no | no | 99.4 |
| Comp. Ex. 18 | 0.018 | 0.008 | 0.010 | 18.8 | 7.6 | yes | yes | 0.41 | no | no | 99.3 |
| Comp. Ex. 19 | 0.018 | 0.008 | 0.010 | 6.2 | 0.7 | yes | yes | 0.37 | yes | yes | 86.7 |
| Comp. Ex. 20 | 0.018 | 0.008 | 0.010 | 13.6 | 5.7 | yes | yes | 0.48 | no | no | 99.4 |
| Comp. Ex. 21 | 0.045 | 0.035 | 0.010 | 6.3 | 1.1 | yes | yes | 0.42 | no | no | 99.3 |
| Comp. Ex. 22 | 0.045 | 0.035 | 0.010 | 6.4 | 1.1 | yes | yes | 0.40 | no | no | 99.3 |
| Comp. Ex. 23 | 0.045 | 0.035 | 0.010 | 6.4 | 1.1 | yes | yes | 0.40 | no | no | 99.3 |
| Comp. Ex. 24 | 0.080 | 0.070 | 0.010 | 5.2 | 1.1 | yes | yes | 0.33 | no | no | 99.1 |
| Comp. Ex. 25 | 0.025 | 0.007 | 0.018 | 8.5 | 2.4 | yes | yes | 0.48 | yes | no | 99.5 |
| Comp. Ex. 26 | 0.025 | 0.007 | 0.018 | 8.0 | 2.2 | yes | yes | 0.44 | yes | no | 99.5 |

In Table, Particles (A) represent the particles having a hexagonal wurtzite structure, and Particles (B) represent the particles having a $ZnTiO_3$-like structure and $Zn_2Ti_3O_8$-like structure. In Crystal phase in Table, 1) represents a hexagonal wurtzite form structure phase, 2) represents a $ZnTiO_3$-like structure and $Zn_2Ti_3O_8$-like structure phase, 3) represents a zinc aluminate ($ZnAl_2O_4$) spinel oxide structure phase, and 4) represents a crystal phase other than 1) to 3), such as an aluminum oxide phase or titanium oxide phase.

TABLE 5

| | Firing conditions | | | | |
|---|---|---|---|---|---|
| | Temperature-elevating rate (° C./hr) | Firing temperature (° C.) | Firing time (hr) | Firing atmosphere | Temperature-lowering rate (° C./hr) |
| Comp. Ex. 1 | 50 | 1100 | 3 | Nitrogen | 100 |
| Comp. Ex. 2 | 50 | 1200 | 3 | Nitrogen | 100 |
| Comp. Ex. 3 | 50 | 1200 | 3 | Nitrogen | 100 |
| Comp. Ex. 4 | 50 | 1200 | 3 | Nitrogen | 100 |
| Comp. Ex. 5 | 50 | 1200 | 3 | Nitrogen | 100 |
| Comp. Ex. 6 | 50 | 1200 | 3 | Nitrogen | 100 |
| Comp. Ex. 7 | 50 | 1200 | 3 | Nitrogen | 100 |

TABLE 5-continued

| | Firing conditions | | | | |
|---|---|---|---|---|---|
| | Temperature-elevating rate (° C./hr) | Firing temperature (° C.) | Firing time (hr) | Firing atmosphere | Temperature-lowering rate (° C./hr) |
| Comp. Ex. 8 | 50 | 1200 | 3 | Nitrogen | 100 |
| Comp. Ex. 9 | 50 | 1200 | 3 | Nitrogen | 100 |
| Comp. Ex. 10 | 50 | 1200 | 3 | Nitrogen | 100 |
| Comp. Ex. 11 | 50 | 1200 | 3 | Nitrogen | 100 |
| Comp. Ex. 12 | 50 | 1200 | 3 | Nitrogen | 100 |
| Comp. Ex. 13 | 50 | 1200 | 3 | Nitrogen | 100 |
| Comp. Ex. 14 | 50 | 1200 | 3 | Nitrogen | 100 |
| Comp. Ex. 15 | 50 | 1550 | 3 | Nitrogen | 100 |
| Comp. Ex. 16 | 50 | 750 | 3 | Nitrogen | 100 |
| Comp. Ex. 17 | 50 | 1200 | 30 | Nitrogen | 100 |
| Comp. Ex. 18 | 50 | 1550 | 3 | Nitrogen | 100 |
| Comp. Ex. 19 | 50 | 750 | 3 | Nitrogen | 100 |
| Comp. Ex. 20 | 50 | 1200 | 30 | Nitrogen | 100 |
| Comp. Ex. 21 | 50 | 1300 | 5 | Nitrogen | 100 |
| Comp. Ex. 22 | 50 | 1300 | 5 | Nitrogen | 100 |
| Comp. Ex. 23 | 50 | 1300 | 5 | Nitrogen | 100 |
| Comp. Ex. 24 | 50 | 1300 | 5 | Nitrogen | 100 |
| Comp. Ex. 25 | 50 | 1400 | 2 | Air | 100 |
| Comp. Ex. 26 | 50 | 1400 | 2 | Air | 100 |

TABLE 6

| | Target properties | | Properties of transparent conductive oxide film | | | |
|---|---|---|---|---|---|---|
| | Center line average roughness (μm) | Discharge property (times/hr) | Sheet resistance (Ω/□) | Transmittance (%) Visible region (400-800 nm) | Transmittance (%) Infrared region (800-1200 nm) | Durability (%) |
| Comp. Ex. 1 | 0.58 | 68.3 | 1560.0 | 84.7 | 90.5 | 999.0 |
| Comp. Ex. 2 | 0.55 | 20.8 | 14.8 | 89.5 | 93.1 | 344.0 |
| Comp. Ex. 3 | 0.42 | 13.7 | 6.2 | 88.6 | 82.3 | 354.0 |
| Comp. Ex. 4 | 0.48 | 18.4 | 3.5 | 88.5 | 75.2 | 81.3 |
| Comp. Ex. 5 | 0.48 | 20.5 | 3.4 | 87.3 | 71.0 | 15.2 |
| Comp. Ex. 6 | 0.37 | 50.2 | 21.8 | 85.3 | 82.2 | 255.3 |
| Comp. Ex. 7 | 0.41 | 15.7 | 15.8 | 86.8 | 74.3 | 18.7 |
| Comp. Ex. 8 | 0.35 | 19.6 | 45.2 | 86.0 | 81.0 | 224.0 |
| Comp. Ex. 9 | 0.38 | 25.3 | 6.5 | 87.1 | 75.3 | 2.7 |
| Comp. Ex. 10 | 0.43 | 10.9 | 8.4 | 86.8 | 77.2 | 2.9 |
| Comp. Ex. 11 | 0.43 | 29.4 | 50.3 | 85.7 | 80.2 | 45.8 |
| Comp. Ex. 12 | 0.44 | 11.8 | 32.7 | 86.8 | 80.4 | 2.5 |
| Comp. Ex. 13 | 0.33 | 6.0 | 33.1 | 87.0 | 82.2 | 1.9 |

TABLE 6-continued

| | Target properties | | Properties of transparent conductive oxide film | | | |
|---|---|---|---|---|---|---|
| | Center line | Discharge | Sheet | Transmittance (%) | | |
| | average roughness (μm) | property (times/hr) | resistance (Ω/□) | Visible region (400-800 nm) | Infrared region (800-1200 nm) | Durability (%) |
| Comp. Ex. 14 | 0.36 | 9.4 | 35.8 | 85.7 | 80.1 | 4.1 |
| Comp. Ex. 15 | 0.38 | 30.1 | 12.5 | 89.0 | 88.3 | 24.2 |
| Comp. Ex. 16 | 0.51 | 24.8 | 12.1 | 89.1 | 89.5 | 23.1 |
| Comp. Ex. 17 | 0.39 | 26.8 | 12.4 | 88.7 | 88.5 | 22.5 |
| Comp. Ex. 18 | 0.38 | 23.2 | 8.2 | 89.3 | 85.6 | 3.6 |
| Comp. Ex. 19 | 0.50 | 20.9 | 8.8 | 89.3 | 85.8 | 3.8 |
| Comp. Ex. 20 | 0.44 | 21.8 | 8.4 | 89.4 | 85.1 | 3.3 |
| Comp. Ex. 21 | 0.43 | 11.3 | 6.8 | 89.0 | 63.8 | 3.8 |
| Comp. Ex. 22 | 0.43 | 15.5 | 6.8 | 88.8 | 63.8 | 4.0 |
| Comp. Ex. 23 | 0.43 | 15.5 | 28.3 | 66.7 | 78.7 | 62.3 |
| Comp. Ex. 24 | 0.32 | 12.6 | 38.2 | 86.3 | 75.5 | 2.6 |
| Comp. Ex. 25 | 0.46 | 42.3 | 13.5 | 88.1 | 86.2 | 2.7 |
| Comp. Ex. 26 | 0.46 | 45.0 | 14.0 | 88.0 | 86.5 | 2.5 |

Examples 40 to 78

Compacts were obtained for Examples 40 to 78 in the same manner as Example 1, except that the mixing proportions of the aluminum oxide powder and titanium oxide powder for obtaining mixed powder (A) were the atomic ratios listed in Table 7, and the mixing proportions of mixed powder (B) and zinc oxide powder for obtaining mixed powder (C) were the atomic ratios listed in Table 7. The compact was fired under the conditions shown in Table 8, to obtain sintered composite oxides for Examples 40 to 78.

The sintered composite oxides of Examples 40 to 78 were evaluated in the same manner as Example 1. As a result, for each of the sintered composite oxides of Examples 40 to 78, there were detected only diffraction peaks attributable to a zinc oxide-containing hexagonal wurtzite structure phase, and an aluminum- and titanium-containing $ZnTiO_3$-like structure and $Zn_2Ti_3O_8$-like structure phase. On the other hand, no diffraction peak was detected for an aluminum oxide phase, a titanium oxide phase or a spinel oxide phase of zinc aluminate with zinc and aluminum in solid solution.

The polished surfaces of the sintered composite oxides of Examples 40 to 78 were also analyzed by SEM and EPMA. As a result, it was confirmed that aluminum and titanium form compounds with zinc and exist as particles with a $ZnTiO_3$-like structure and a $Zn_2Ti_3O_8$-like structure. Furthermore, it was confirmed that the particles coexist with particles in a hexagonal wurtzite structure phase. The mean particle sizes of the particles were determined by the method described above. The evaluation results for the sintered composite oxides of Examples 40 to 78 are shown in Table 7.

Sputtering targets for Examples 40 to 78 were fabricated and evaluated in the same manner as Example 1. The results were as shown in Table 9. The sputtering targets of Examples 40 to 78 were each used in the same manner as Example 1 to form films by DC magnetron sputtering, to obtain transparent conductive oxide films for Examples 40 to 78. The sputtering film formation conditions were the same as in Example 1.

The number of anomalous discharges produced per hour during sputtering is listed as "discharge property" in Table 9. The resistance, transmittance and durability of the transparent conductive oxide films of Examples 40 to 78 are shown in Table 9.

The generated phases of the transparent conductive oxide films of Examples 40 to 78 were measured in the same manner as Example 1. As a result, the transparent conductive oxide films of Examples 40 to 78 were all found to be composed entirely of a hexagonal wurtzite structure phase.

TABLE 7

| | Final composition of powder and sintered composition (atomic ratio) | | | Sintered composite oxide properties | | | | | | | |
|---|---|---|---|---|---|---|---|---|---|---|---|
| | | | | Mean particle size (μm) | | Crystal phase (X-ray diffraction test) | | | | | Relative |
| | (Al + Ti)/ (Zn + Al + Ti) | Al/ (Zn + Al + Ti) | Ti/ (Zn + Al + Ti) | Particles (A) | Particles (B) | (1) | (2) | Ax/ (Ax + Ay) | (3) | (4) | density (%) |
| Example 40 | 0.006 | 0.003 | 0.003 | 15.4 | 2.0 | yes | yes | 0.18 | no | no | 98.4 |
| Example 41 | 0.013 | 0.010 | 0.003 | 11.2 | 1.8 | yes | yes | 0.22 | no | no | 99.1 |
| Example 42 | 0.023 | 0.020 | 0.003 | 5.8 | 0.6 | yes | yes | 0.20 | no | no | 99.5 |
| Example 43 | 0.028 | 0.025 | 0.003 | 5.8 | 0.7 | yes | yes | 0.18 | no | no | 99.5 |
| Example 44 | 0.013 | 0.003 | 0.010 | 8.3 | 0.9 | yes | yes | 0.24 | no | no | 99.4 |
| Example 45 | 0.020 | 0.010 | 0.010 | 5.6 | 0.7 | yes | yes | 0.45 | no | no | 99.3 |
| Example 46 | 0.030 | 0.020 | 0.010 | 6.1 | 0.5 | yes | yes | 0.35 | no | no | 99.8 |
| Example 47 | 0.035 | 0.025 | 0.010 | 6.3 | 0.7 | yes | yes | 0.45 | no | no | 99.7 |
| Example 48 | 0.023 | 0.003 | 0.020 | 5.3 | 1.0 | yes | yes | 0.54 | no | no | 99.5 |
| Example 49 | 0.030 | 0.010 | 0.020 | 7.2 | 1.7 | yes | yes | 0.61 | no | no | 99.6 |
| Example 50 | 0.045 | 0.025 | 0.020 | 5.5 | 1.0 | yes | yes | 0.50 | no | no | 99.6 |
| Example 51 | 0.028 | 0.003 | 0.025 | 6.4 | 1.3 | yes | yes | 0.57 | no | no | 99.3 |
| Example 52 | 0.035 | 0.010 | 0.025 | 5.8 | 1.1 | yes | yes | 0.68 | no | no | 99.2 |
| Example 53 | 0.050 | 0.025 | 0.025 | 8.0 | 1.8 | yes | yes | 0.47 | no | no | 99.7 |
| Example 54 | 0.041 | 0.003 | 0.038 | 6.4 | 2.4 | yes | yes | 0.64 | no | no | 99.8 |

TABLE 7-continued

| | Final composition of powder and sintered composition (atomic ratio) | | | Sintered composite oxide properties | | | | | | | |
|---|---|---|---|---|---|---|---|---|---|---|---|
| | | | | Mean particle size (μm) | | Crystal phase (X-ray diffraction test) | | | | | Relative density (%) |
| | (Al + Ti)/ (Zn + Al + Ti) | Al/ (Zn + Al + Ti) | Ti/ (Zn + Al + Ti) | Particles (A) | Particles (B) | (1) | (2) | Ax/ (Ax + Ay) | (3) | (4) | |
| Example 55 | 0.048 | 0.010 | 0.038 | 7.3 | 1.8 | yes | yes | 0.66 | no | no | 99.5 |
| Example 56 | 0.050 | 0.003 | 0.047 | 6.7 | 1.4 | yes | yes | 0.66 | no | no | 99.6 |
| Example 57 | 0.013 | 0.010 | 0.003 | 18.6 | 4.7 | yes | yes | 0.24 | no | no | 99.2 |
| Example 58 | 0.013 | 0.010 | 0.003 | 14.0 | 4.0 | yes | yes | 0.24 | no | no | 99.4 |
| Example 59 | 0.013 | 0.010 | 0.003 | 11.8 | 2.0 | yes | yes | 0.18 | no | no | 99.2 |
| Example 60 | 0.013 | 0.010 | 0.003 | 6.6 | 0.6 | yes | yes | 0.17 | no | no | 98.0 |
| Example 61 | 0.013 | 0.010 | 0.003 | 12.5 | 2.2 | yes | yes | 0.22 | no | no | 99.3 |
| Example 62 | 0.013 | 0.010 | 0.003 | 15.0 | 3.5 | yes | yes | 0.26 | no | no | 99.2 |
| Example 63 | 0.013 | 0.010 | 0.003 | 11.4 | 2.1 | yes | yes | 0.22 | no | no | 99.2 |
| Example 64 | 0.013 | 0.010 | 0.003 | 11.9 | 2.0 | yes | yes | 0.20 | no | no | 99.3 |
| Example 65 | 0.020 | 0.010 | 0.010 | 10.8 | 3.0 | yes | yes | 0.50 | no | no | 99.2 |
| Example 66 | 0.020 | 0.010 | 0.010 | 9.2 | 2.6 | yes | yes | 0.46 | no | no | 99.4 |
| Example 67 | 0.020 | 0.010 | 0.010 | 6.0 | 1.8 | yes | yes | 0.44 | no | no | 99.4 |
| Example 68 | 0.020 | 0.010 | 0.010 | 5.8 | 0.6 | yes | yes | 0.40 | no | no | 98.3 |
| Example 69 | 0.020 | 0.010 | 0.010 | 7.3 | 2.1 | yes | yes | 0.45 | no | no | 99.5 |
| Example 70 | 0.020 | 0.010 | 0.010 | 8.6 | 2.3 | yes | yes | 0.47 | no | no | 99.4 |
| Example 71 | 0.020 | 0.010 | 0.010 | 7.4 | 1.6 | yes | yes | 0.48 | no | no | 99.1 |
| Example 72 | 0.020 | 0.010 | 0.010 | 6.0 | 1.8 | yes | yes | 0.44 | no | no | 99.1 |
| Example 73 | 0.013 | 0.010 | 0.003 | 11.2 | 1.8 | yes | yes | 0.22 | no | no | 99.1 |
| Example 74 | 0.013 | 0.010 | 0.003 | 11.2 | 1.8 | yes | yes | 0.22 | no | no | 99.1 |
| Example 75 | 0.013 | 0.010 | 0.003 | 11.2 | 1.8 | yes | yes | 0.22 | no | no | 99.1 |
| Example 76 | 0.020 | 0.010 | 0.010 | 5.6 | 0.7 | yes | yes | 0.45 | no | no | 99.3 |
| Example 77 | 0.020 | 0.010 | 0.010 | 5.6 | 0.7 | yes | yes | 0.45 | no | no | 99.3 |
| Example 78 | 0.020 | 0.010 | 0.010 | 5.6 | 0.7 | yes | yes | 0.45 | no | no | 99.3 |

In Table, Particles (A) represent the particles having a hexagonal wurtzite structure, and Particles (B) represent the particles having a $ZnTiO_3$-like structure and $Zn_2Ti_3O_8$-like structure. In Crystal phase in Table, 1) represents a hexagonal wurtzite form structure phase, 2) represents a $ZnTiO_3$-like structure and $Zn_2Ti_3O_8$-like structure phase, 3) represents a zinc aluminate ($ZnAl_2O_4$) spinel oxide structure phase, and 4) represents a crystal phase other than 1) to 3), such as an aluminum oxide phase or titanium oxide phase.

TABLE 8

| | Firing conditions | | | | |
|---|---|---|---|---|---|
| | Temperature-elevating rate (° C./hr) | Firing temperature (° C.) | Firing time (hr) | Firing atmosphere | Temperature-lowering rate (° C./hr) |
| Example 40 | 50 | 1200 | 3 | Nitrogen | 100 |
| Example 41 | 50 | 1200 | 3 | Nitrogen | 100 |
| Example 42 | 50 | 1200 | 3 | Nitrogen | 100 |
| Example 43 | 50 | 1200 | 3 | Nitrogen | 100 |
| Example 44 | 50 | 1200 | 3 | Nitrogen | 100 |
| Example 45 | 50 | 1200 | 3 | Nitrogen | 100 |
| Example 46 | 50 | 1200 | 3 | Nitrogen | 100 |
| Example 47 | 50 | 1200 | 3 | Nitrogen | 100 |
| Example 48 | 50 | 1200 | 3 | Nitrogen | 100 |
| Example 49 | 50 | 1200 | 3 | Nitrogen | 100 |
| Example 50 | 50 | 1200 | 3 | Nitrogen | 100 |
| Example 51 | 50 | 1200 | 3 | Nitrogen | 100 |
| Example 52 | 50 | 1200 | 3 | Nitrogen | 100 |
| Example 53 | 50 | 1200 | 3 | Nitrogen | 100 |
| Example 54 | 50 | 1200 | 3 | Nitrogen | 100 |
| Example 55 | 50 | 1200 | 3 | Nitrogen | 100 |
| Example 56 | 50 | 1200 | 3 | Nitrogen | 100 |
| Example 57 | 50 | 1500 | 3 | Nitrogen | 100 |
| Example 58 | 50 | 1400 | 3 | Nitrogen | 100 |
| Example 59 | 50 | 1100 | 3 | Nitrogen | 100 |
| Example 60 | 50 | 900 | 3 | Nitrogen | 100 |
| Example 61 | 50 | 1200 | 5 | Nitrogen | 100 |
| Example 62 | 50 | 1200 | 10 | Nitrogen | 100 |
| Example 63 | 50 | 1200 | 3 | Air | 100 |
| Example 64 | 50 | 1100 | 3 | Air | 100 |
| Example 65 | 50 | 1500 | 3 | Nitrogen | 100 |
| Example 66 | 50 | 1400 | 3 | Nitrogen | 100 |
| Example 67 | 50 | 1100 | 3 | Nitrogen | 100 |
| Example 68 | 50 | 900 | 3 | Nitrogen | 100 |
| Example 69 | 50 | 1200 | 5 | Nitrogen | 100 |
| Example 70 | 50 | 1200 | 10 | Nitrogen | 100 |
| Example 71 | 50 | 1200 | 3 | Air | 100 |
| Example 72 | 50 | 1100 | 3 | Air | 100 |
| Example 73 | 50 | 1200 | 3 | Nitrogen | 100 |
| Example 74 | 50 | 1200 | 3 | Nitrogen | 100 |
| Example 75 | 50 | 1200 | 3 | Nitrogen | 100 |
| Example 76 | 50 | 1200 | 3 | Nitrogen | 100 |
| Example 77 | 50 | 1200 | 3 | Nitrogen | 100 |
| Example 78 | 50 | 1200 | 3 | Nitrogen | 100 |

TABLE 9

| | Target properties | | Properties of transparent conductive oxide film | | | |
|---|---|---|---|---|---|---|
| | Center line average roughness (μm) | Discharge property (times/hr) | Sheet resistance (Ω/□) | Transmittance (%) Visible region (400-800 nm) | Transmittance (%) Infrared region (800-1200 nm) | Durability (%) |
| Example 40 | 0.55 | 11.6 | 18.9 | 88.1 | 92.8 | 25.1 |
| Example 41 | 0.49 | 10.7 | 12.1 | 89.0 | 90.1 | 22.2 |
| Example 42 | 0.41 | 11.0 | 7.4 | 88.4 | 84.0 | 15.3 |
| Example 43 | 0.48 | 11.3 | 5.1 | 87.2 | 81.7 | 12.2 |
| Example 44 | 0.37 | 6.2 | 8.3 | 88.0 | 90.3 | 6.2 |
| Example 45 | 0.35 | 6.6 | 8.0 | 89.5 | 85.8 | 3.4 |
| Example 46 | 0.48 | 9.5 | 8.5 | 89.8 | 80.2 | 2.2 |
| Example 47 | 0.42 | 9.2 | 9.3 | 89.3 | 81.4 | 1.8 |
| Example 48 | 0.35 | 7.8 | 9.8 | 87.7 | 94.3 | 2.2 |
| Example 49 | 0.45 | 12.2 | 13.1 | 88.4 | 86.8 | 2.4 |
| Example 50 | 0.40 | 11.4 | 7.5 | 87.9 | 82.7 | 1.6 |
| Example 51 | 0.40 | 7.3 | 17.6 | 87.8 | 89.1 | 2.0 |
| Example 52 | 0.42 | 8.5 | 15.2 | 89.2 | 83.0 | 2.5 |
| Example 53 | 0.38 | 7.1 | 17.8 | 88.7 | 82.6 | 2.3 |
| Example 54 | 0.41 | 6.4 | 26.2 | 87.2 | 87.7 | 2.6 |
| Example 55 | 0.41 | 8.7 | 22.1 | 88.0 | 85.3 | 2.2 |
| Example 56 | 0.47 | 5.1 | 16.4 | 86.9 | 85.1 | 2.0 |
| Example 57 | 0.41 | 13.3 | 12.1 | 88.8 | 90.0 | 22.2 |
| Example 58 | 0.41 | 11.5 | 11.9 | 88.8 | 89.9 | 21.6 |
| Example 59 | 0.53 | 10.3 | 12.2 | 89.0 | 90.3 | 21.7 |
| Example 60 | 0.48 | 13.4 | 12.0 | 88.6 | 90.1 | 21.8 |
| Example 61 | 0.51 | 10.4 | 12.1 | 89.2 | 90.1 | 22.4 |
| Example 62 | 0.44 | 11.0 | 12.1 | 88.9 | 89.8 | 22.2 |
| Example 63 | 0.46 | 10.9 | 12.0 | 89.0 | 90.1 | 22.0 |
| Example 64 | 0.43 | 10.6 | 11.8 | 88.9 | 90.0 | 22.4 |
| Example 65 | 0.37 | 8.9 | 13.0 | 89.4 | 85.6 | 3.4 |
| Example 66 | 0.40 | 8.3 | 13.1 | 89.4 | 85.8 | 3.1 |
| Example 67 | 0.35 | 6.2 | 13.1 | 89.7 | 85.8 | 3.8 |
| Example 68 | 0.38 | 9.2 | 13.0 | 89.5 | 86.0 | 3.5 |
| Example 69 | 0.42 | 7.8 | 12.8 | 89.3 | 86.0 | 3.5 |
| Example 70 | 0.46 | 8.5 | 13.2 | 89.8 | 85.8 | 3.3 |
| Example 71 | 0.35 | 6.9 | 13.0 | 89.3 | 85.7 | 3.4 |
| Example 72 | 0.42 | 6.8 | 12.8 | 89.5 | 85.9 | 3.2 |
| Example 73 | 1.85 | 11.6 | 11.9 | 89.2 | 90.0 | 21.8 |
| Example 74 | 2.73 | 13.1 | 12.1 | 89.0 | 90.0 | 22.2 |
| Example 75 | 3.14 | 18.8 | 12.0 | 88.7 | 90.1 | 22.1 |
| Example 76 | 1.73 | 9.7 | 13.3 | 89.6 | 86.0 | 3.3 |
| Example 77 | 2.88 | 10.9 | 13.1 | 89.2 | 85.8 | 3.4 |
| Example 78 | 3.16 | 15.2 | 13.4 | 89.5 | 85.8 | 3.4 |

Comparative Example 27

Fabrication of Sintered Composite Oxide

The zinc oxide powder was pulverized with a dry ball mill to a mean particle size of no greater than 1 μm. The powder was subjected to die molding using a die with a diameter of 150 mm at 0.3 ton/cm$^2$ (29.42 MPa), and then cm molding at 3.0 ton/cm$^2$ (294.2 MPa), to obtain a compact. The compact was fired under the conditions shown in Table 11, to obtain a sintered composite oxide for Comparative Example 27.

The sintered composite oxide of Comparative Example 27 was evaluated in the same manner as Example 1. As a result, in the sintered composite oxide of Comparative Example 27, there was detected only a diffraction peak attributable to a zinc oxide-containing hexagonal wurtzite structure phase. The mean particle size of the particles of the sintered composite oxide was determined in the same manner as Example 1. The evaluation results for the sintered composite oxide of Comparative Example 27 are shown in Table 10.

A sputtering target for Comparative Example 27 was fabricated and evaluated in the same manner as Example 1. The number of anomalous discharges produced per hour during sputtering is listed as "discharge property" in Table 12.

The sputtering target of Comparative Example 27 was used in the same manner as Example 1 to form a film by DC magnetron sputtering, to obtain a transparent conductive oxide film for Comparative Example 27. The sputtering film formation conditions were the same as in Example 1. The resistance, transmittance and durability of the transparent conductive oxide film of Comparative Example 27 are shown in Table 12.

The generated phase of the transparent conductive oxide film of Comparative Example 27 was measured in the same manner as Example 1. As a result, the transparent conductive oxide film of Comparative Example 27 was found to be composed entirely of a hexagonal wurtzite structure phase.

Comparative Examples 28 to 31

The aforementioned aluminum oxide powder and zinc oxide powder were combined with the Al and Zn atomic ratios of Comparative Examples 28 to 31 in Table 10, blended with a wet bead mill, and spray-dried. The mean particle size was no greater than 1 μm. The obtained powder was subjected to die molding using a die with a diameter of 150 mm at 0.3 ton/cm$^2$ (29.42 MPa), and then CIP molding at 3.0 ton/cm$^2$ (294.2 MPa), to obtain a compact. The compact was fired under the conditions shown in Table 11, to obtain sintered composite oxides for Comparative Examples 28 to 31.

The sintered composite oxides of Comparative Examples 28 to 31 were evaluated in the same manner as Example 1. As a result, in the sintered composite oxides of Comparative Examples 28 to 31, there were detected only diffraction peaks attributable to a zinc oxide-containing hexagonal wurtzite structure phase, and a spinel oxide phase of zinc aluminate with zinc and aluminum in solid solution. However, no diffraction peak attributable to an aluminum oxide phase was detected. The evaluation results for the sintered composite oxides of Comparative Examples 28 to 31 are shown in Table 12.

Sputtering targets for Comparative Examples 28 to 31 were fabricated and evaluated in the same manner as Example 1. The number of anomalous discharges produced per hour during sputtering is listed as "discharge property" in Table 12.

The sputtering targets of Comparative Examples 28 to 31 were each used in the same manner as Example 1 to form films by DC magnetron sputtering, to obtain transparent conductive oxide films for Comparative Examples 28 to 31. The sputtering film formation conditions were the same as in Example 1. The resistance, transmittance and durability of the transparent conductive oxide films of Comparative Examples 28 to 31 are shown in Table 12.

The generated phases of the transparent conductive oxide films of Comparative Examples 28 to 31 were measured in the same manner as Example 1. As a result, the transparent conductive oxide films were all found to be composed entirely of a hexagonal wurtzite structure phase.

Comparative Example 32

The aforementioned titanium oxide powder and zinc oxide powder were combined with the Ti and Zn atomic ratio of Comparative Example 32 in Table 10, blended with a wet bead mill, and spray-dried. The mean particle size was no greater than 1 μm. The obtained powder was subjected to die molding using a die with a diameter of 150 mm at 0.3 ton/cm$^2$ (29.42 MPa), and then CIP molding at 3.0 ton/cm$^2$ (294.2 MPa), to obtain a compact. The compact was fired under the conditions shown in Table 11, to obtain a sintered composite oxide for Comparative Example 32.

The sintered composite oxide of Comparative Example 32 was evaluated in the same manner as Example 1. As a result, for the sintered composite oxide of Comparative Example 32, there were detected only diffraction peaks attributable to a zinc oxide-containing hexagonal wurtzite structure phase, and a titanium-containing $ZnTiO_3$-like structure and $Zn_2Ti_3O_8$-like structure phase. However, no diffraction peak attributable to a titanium oxide phase was detected.

Also, the polished surface of the sintered composite oxide of Comparative Example 32 was analyzed by SEM and EPMA, and the mean particle sizes of the $ZnTiO_3$-like structured and $Zn_2Ti_3O_8$-like structured particles and the hexagonal wurtzite structure phase particles were determined in the same manner as Example 1. The evaluation results for the sintered composite oxide of Comparative Example 32 are shown in Table 10.

A sputtering target for Comparative Example 32 was fabricated and evaluated in the same manner as Example 1. The number of anomalous discharges produced per hour during sputtering is listed as "discharge property" in Table 12.

The sputtering target of Comparative Example 32 was used in the same manner as Example 1 to form a film by DC magnetron sputtering, to obtain a transparent conductive oxide film for Comparative Example 32. The sputtering film formation conditions were the same as in Example 1. The resistance, transmittance and durability of the transparent conductive oxide film of Comparative Example 32 are shown in Table 12.

The generated phase of the transparent conductive oxide film of Comparative Example 32 was measured in the same manner as Example 1. As a result, the transparent conductive oxide film of Comparative Example 32 was found to be composed entirely of a hexagonal wurtzite structure phase.

Comparative Examples 33, 35, 36 and 38 to 47

Compacts were obtained for Comparative Examples 33, 35, 36 and 38 to 47 in the same manner as Example 1, except that the mixing proportions of the aluminum oxide powder and titanium oxide powder for obtaining mixed powder (A) were the atomic ratios listed in Table 10, and the mixing proportions of mixed powder (B) and zinc oxide powder for obtaining mixed powder (C) were the atomic ratios listed in Table 10. Each compact was fired under the conditions shown in Table 11, to obtain sintered composite oxides for Comparative Examples 33, 35, 36 and 38 to 47.

The sintered composite oxides were evaluated in the same manner as Example 1. As a result, for each of the sintered composite oxides of Comparative Examples 33, 35, 36, 38 to 41, 43, 44, 46 and 47, there were detected only diffraction peaks attributable to a zinc oxide-containing hexagonal wurtzite structure phase, and an aluminum- and titanium-containing $ZnTiO_3$-like structure and $Zn_2Ti_3O_8$-like structure phase. On the other hand, no diffraction peak was detected for an aluminum oxide phase, a titanium oxide phase or a spinel oxide phase of zinc aluminate with zinc and aluminum in solid solution.

The polished surfaces of the sintered composite oxides of Comparative Examples 33, 35, 36, 38 to 41, 43, 44, 46 and 47 were also analyzed by SEM and EPMA. As a result, it was confirmed that aluminum and titanium form compounds with zinc and exist as particles with a $ZnTiO_3$-like structure and a $Zn_2Ti_3O_8$-like structure. Furthermore, it was confirmed that the particles coexist with particles in a hexagonal wurtzite structure phase. The mean particle sizes of each of the particles were determined in the same manner as Example 1.

In contrast, for each of the sintered composite oxides of Comparative Examples 42 and 45, there were detected diffraction peaks attributable to a zinc oxide-containing hexagonal wurtzite structure phase, and an aluminum- and titanium-containing $ZnTiO_3$-like structure and $Zn_2Ti_3O_8$-like structure phase, as well as trace diffraction peaks attributable to an aluminum oxide phase, a titanium oxide phase and a spinel oxide phase of zinc aluminate with zinc and aluminum in solid solution. The polished surfaces of the sintered composite oxides were analyzed by SEM and EPMA, in the same manner as Example 1. The mean particle sizes of the particles were also determined in the same manner as Example 1.

The evaluation results for the sintered composite oxides of Comparative Examples 33, 35, 36 and 38 to 47 are shown in Table 10. Sputtering targets were fabricated and evaluated for these comparative examples, in the same manner as Example 1. The number of anomalous discharges produced per hour during sputtering is listed as "discharge property" in Table 12.

The sputtering targets of the comparative examples were each used in the same manner as Example 1 to form films by DC magnetron sputtering, to obtain transparent conductive oxide films. The sputtering film formation conditions were the same as in Example 1. The resistance, transmittance and durability of the transparent conductive oxide films of Comparative Examples 33, 35, 36 and 38 to 47 are shown in Table 12.

The generated phases of the transparent conductive oxide films of Comparative Examples 33, 35, 36 and 38 to 47 were measured in the same manner as Example 1. As a result, the transparent conductive oxide films of Comparative Examples 33, 35, 36 and 38 to 47 were all found to be composed entirely of a hexagonal wurtzite structure phase.

Comparative Examples 34 and 37

The aforementioned titanium oxide powder and zinc oxide powder were each combined with the Ti and Zn atomic ratios of Comparative Examples 34 and 37 in Table 10, blended with a wet bead mill, and spray-dried. The mean particle size was no greater than 1 μm. The obtained powder was subjected to die molding using a die with a diameter of 150 mm at 0.3 ton/cm² (29.42 MPa), and then CIP molding at 3.0 ton/cm² (294.2 MPa), to obtain a compact. Each compact was fired under the conditions shown in Table 11, to obtain sintered composite oxides for Comparative Examples 34 and 37.

The sintered composite oxides of Comparative Examples 34 and 37 were evaluated in the same manner as Example 1. As a result, for the sintered composite oxides of Comparative Examples 34 and 37, there were detected only diffraction peaks attributable to a zinc oxide-containing hexagonal wurtzite structure phase, and a titanium-containing $ZnTiO_3$-like structure and $Zn_2Ti_3O_8$-like structure phase. However, no diffraction peak attributable to a titanium oxide phase was detected.

Also, the polished surfaces of the sintered composite oxides of Comparative Examples 34 and 37 were analyzed by SEM and EPMA, and the mean particle sizes of the $ZnTiO_3$-like structured and $Zn_2Ti_3O_8$-like structured particles and the hexagonal wurtzite structure phase particles were determined in the same manner as Example 1. The evaluation results for the sintered composite oxides of Comparative Examples 34 and 37 are shown in Table 10.

Sputtering targets for Comparative Examples 34 and 37 were fabricated and evaluated in the same manner as Example 1. The number of anomalous discharges produced per hour during sputtering is listed as "discharge property" in Table 12.

The sputtering targets of Comparative Examples 34 and 37 were used in the same manner as Example 1 to form films by DC magnetron sputtering, to obtain transparent conductive oxide films for Comparative Examples 34 and 37. The sputtering film formation conditions were the same as in Example 1. The resistance, transmittance and durability of the transparent conductive oxide films of Comparative Examples 34 and 37 are shown in Table 12.

The generated phases of the transparent conductive oxide films of Comparative Examples 34 and 37 were measured in the same manner as Example 1. As a result, the transparent conductive oxide films were all found to be composed entirely of a hexagonal wurtzite structure phase.

Comparative Examples 48 to 50

The aforementioned zinc oxide powder, aluminum oxide powder and titanium oxide powder were combined with the Zn, Al and Ti atomic ratios of Comparative Examples 48 to 50 in Table 10, and blended with a wet ball mill. Polyvinyl alcohol was added to 1 wt % with respect to the total solid weight of the starting powder. After spray-drying, the obtained powder was subjected to CIP molding at 3.0 ton/cm² (294.2 MPa), and degreased in air at 500° C. to obtain a compact. The compact was fired under the conditions shown in Table 11, to obtain sintered composite oxides for Comparative Examples 48 to 50.

The sintered composite oxides of Comparative Examples 48 to 50 were evaluated in the same manner as Example 1. As a result, for each of the sintered composite oxides of Comparative Examples 48 to 50, there were detected only diffraction peaks attributable to a zinc oxide-containing hexagonal wurtzite structure phase, and an aluminum- and titanium-containing $ZnTiO_3$-like structure and $Zn_2Ti_3O_8$-like structure phase. On the other hand, no diffraction peak was detected for an aluminum oxide phase, a titanium oxide phase or a spinel oxide phase of zinc aluminate with zinc and aluminum in solid solution.

The polished surfaces of the sintered composite oxides of Comparative Examples 48 to 50 were also analyzed by SEM and EPMA. As a result, it was confirmed that aluminum and titanium form compounds with zinc and exist as particles with a $ZnTiO_3$-like structure and a $Zn_2Ti_3O_8$-like structure. Furthermore, it was confirmed that the particles coexist with particles in a hexagonal wurtzite structure phase. The mean particle sizes of each of the particles were determined by the same method as Example 1. The evaluation results for the sintered composite oxides of Comparative Examples 48 to 50 are shown in Table 12.

Sputtering targets for Comparative Examples 48 to 50 were fabricated and evaluated in the same manner as Example 1. The number of anomalous discharges produced per hour during sputtering is listed as "discharge property" in Table 12.

The sputtering targets of Comparative Examples 48 to 50 were each used in the same manner as Example 1 to form films by DC magnetron sputtering, to obtain transparent conductive oxide films for Comparative Examples 48 to 50. The sputtering film formation conditions for Comparative Example 49 were as follows. The sputtering film formation conditions for Comparative Examples 48 and 50 were the same as Example 1.

(Sputtering Film Formation Conditions)
Apparatus: DC magnetron sputtering apparatus
Magnetic field intensity: 1000 Gauss (directly above target, horizontal component)
Substrate temperature: 25° C.
Ultimate vacuum: $5 \times 10^{-5}$ Pa
Sputtering gas: argon
Sputtering gas pressure: 0.5 Pa
DC power: 300 W
Film thickness: 1000 nm
Substrate used: Non-alkaline glass (#1737 glass by Corning, Inc., thickness: 0.7 mm)

The resistance, transmittance and durability of the transparent conductive oxide films of Comparative Examples 48 to 50 are shown in Table 12.

The generated phases of the transparent conductive oxide films of Comparative Examples 48 to 50 were measured in the same manner as Example 1. As a result, the transparent conductive oxide films were all found to be composed entirely of a hexagonal wurtzite structure phase.

Comparative Example 51

The aluminum oxide powder and titanium oxide powder were weighed out to the Al and Ti atomic ratio listed in Table 10. The powders were mixed with zinc oxide in an equimolar amount as the total number of moles of aluminum oxide and titanium oxide, blended with a wet ball mill and dried to obtain a mixed powder. The mixed powder was calcined in air at 1000° C. to obtain a calcined powder. Zinc oxide powder was added to the calcined powder to the atomic ratios of Al, Ti and Zn listed in Table 10, and blended with a wet ball mill. Polyvinyl alcohol was added to 1 wt % with respect to the total solid weight of the starting powder.

After spray-drying, the obtained powder was subjected to die molding using a die with a diameter of 150 mm at 0.3 ton/cm² (29.42 MPa), and then CIP molding at 3.0 ton/cm² (294.2 MPa) and degreasing in air at 500° C., to obtain a compact. The compact was fired under the conditions shown in Table 11, to fabricate a sintered composite oxide compact.

The sintered composite oxide of Comparative Example 51 was evaluated in the same manner as Example 1. As a result, for the sintered composite oxide of Comparative Example 51, there were observed diffraction peaks attributable to a zinc oxide-containing hexagonal wurtzite structure phase, an aluminum- and titanium-containing $ZnTiO_3$-like structure and $Zn_2Ti_3O_8$-like structure phase, and a spinel oxide phase of zinc aluminate with zinc and aluminum in solid solution. However, no diffraction peak attributable to an aluminum oxide phase or titanium oxide phase was detected. This confirmed the coexistence of a composite oxide phase of aluminum and zinc, and a composite oxide phase of titanium and zinc.

The mean particle sizes of the particles were also determined in the same manner as Example 1. The evaluation results for the sintered composite oxide of Comparative Example 51 are shown in Table 10.

A sputtering target for Comparative Example 51 was fabricated and evaluated in the same manner as Example 1. The number of anomalous discharges produced per hour during sputtering is listed as "discharge property" in Table 12.

The sputtering target of Comparative Example 51 was used in the same manner as Example 1 to form a film by DC magnetron sputtering, to obtain a transparent conductive oxide film for Comparative Example 51. The sputtering film formation conditions were the same as in Example 1. The resistance, transmittance and durability of the transparent conductive oxide film are shown in Table 12.

The generated phases of the transparent conductive oxide film were measured in the same manner as Example 1. As a result, the transparent conductive oxide film of Comparative Example 51 was found to be composed entirely of a hexagonal wurtzite structure phase.

Comparative Example 52

After blending the aforementioned aluminum oxide powder and zinc oxide powder in equimolar amounts using a wet ball mill, the blend was dried to obtain mixed powder A. The mixed powder A was calcined in air at 1000° C. Next, the aforementioned titanium oxide powder and zinc oxide powder were mixed in equimolar amounts using a wet ball mill, and the blend was dried to obtain mixed powder B. The mixed powder B was calcined in air at 1000° C.

The calcined mixed powders A and B and zinc oxide powder were mixed with a wet ball mill to the Al, Ti and Zn composition listed in Table 10. Polyvinyl alcohol was added to 1 wt % with respect to the total solid weight of the starting powder. After spray-drying, the obtained powder was subjected to die molding using a die with a diameter of 150 mm at 0.3 ton/cm² (29.42 MPa), and then CIP molding at 3.0 ton/cm² (294.2 MPa) and degreasing in air at 500° C., to obtain a compact. The compact was fired under the conditions shown in Table 11, to fabricate a sintered composite oxide compact.

The sintered composite oxide of Comparative Example 52 was evaluated in the same manner as Example 1. As a result, for the sintered composite oxide of Comparative Example 52, there were observed diffraction peaks attributable to a zinc oxide-containing hexagonal wurtzite structure phase, an aluminum- and titanium-containing $ZnTiO_3$-like structure and $Zn_2Ti_3O_8$-like structure phase, and a spinel oxide phase of zinc aluminate with zinc and aluminum in solid solution. However, no diffraction peak attributable to an aluminum oxide phase or titanium oxide phase was detected. This confirmed the coexistence of a composite oxide phase of aluminum and zinc, and a composite oxide phase of titanium and zinc.

The mean particle sizes of the particles were also determined in the same manner as Example 1. The evaluation results for the sintered composite oxide of Comparative Example 52 are shown in Table 10.

A sputtering target for Comparative Example 52 was fabricated and evaluated in the same manner as Example 1. The number of anomalous discharges produced per hour during sputtering is listed as "discharge property" in Table 12.

The sputtering target of Comparative Example 52 was used in the same manner as Example 1 to form a film by DC magnetron sputtering, to obtain a transparent conductive oxide film for Comparative Example 52. The sputtering film formation conditions were the same as in Example 1. The resistance, transmittance and durability of the transparent conductive oxide film are shown in Table 12.

The generated phases of the transparent conductive oxide film were measured in the same manner as Example 1. As a result, the transparent conductive oxide film of Comparative Example 52 was found to be composed entirely of a hexagonal wurtzite structure phase.

Comparative Example 53

A compact was obtained for Comparative Example 53 in the same manner as Example 1, except that the mixing proportion of the aluminum oxide powder and titanium oxide powder for obtaining mixed powder (A) was the atomic ratio listed in Table 10, and the mixing proportion of mixed powder (B) and zinc oxide powder for obtaining mixed powder (C) was the atomic ratio listed in Table 10. The compact was fired under the conditions shown in Table 11, to obtain a sintered composite oxide for Comparative Example 53.

The sintered composite oxide of Comparative Example 53 was evaluated in the same manner as Example 1. As a result, for this sintered composite oxide there were detected only diffraction peaks attributable to a zinc oxide-containing hexagonal wurtzite structure phase, and an aluminum- and titanium-containing $ZnTiO_3$-like structure and $Zn_2Ti_3O_8$-like structure phase. On the other hand, no diffraction peak was detected for an aluminum oxide phase, a titanium oxide phase or a spinel oxide phase of zinc aluminate with zinc and aluminum in solid solution.

The polished surface of the sintered composite oxide was also analyzed by SEM and EPMA. As a result, it was confirmed that aluminum and titanium form compounds with zinc and exist as particles with a $ZnTiO_3$-like structure and a $Zn_2Ti_3O_8$-like structure. Furthermore, it was confirmed that the particles coexist with particles in a hexagonal wurtzite structure phase. The mean particle sizes of the particles were determined by the method described above. The evaluation results for the sintered composite oxide are shown in Table 10.

A sputtering target for Comparative Example 53 was fabricated and evaluated in the same manner as Example 1. The number of anomalous discharges produced per hour during sputtering is listed as "discharge property" in Table 12.

The sputtering target of Comparative Example 53 was used in the same manner as Example 1 to form a film by DC magnetron sputtering, to obtain a transparent conductive oxide film for Comparative Example 53. The sputtering film formation conditions were the same as in Example 1. The resistance, transmittance and durability of the transparent conductive oxide film of Comparative Example 53 are shown in Table 12.

The generated phase of the transparent conductive oxide film of Comparative Example 53 was measured in the same manner as Example 1. As a result, the transparent conductive oxide film of Comparative Example 53 was found to be composed entirely of a hexagonal wurtzite structure phase.

Comparative Example 54

After blending the aforementioned aluminum oxide powder and zinc oxide powder to the Al and Zn atomic ratio listed in Table 10 using a wet bead mill, the blend was dried to obtain a mixed powder. The mixed powder was calcined in air at 1400° C. and then pulverized to prepare a calcined powder with a mean particle size of no greater than 1 μm. To this calcined powder there was further added titanium oxide powder to Al, Zn and Ti in the atomic ratio listed in Table 10, and the mixture was blended with a dry ball mill. The mean particle size after blending was no greater than 1 μm. The obtained powder was subjected to die molding using a die with a diameter of 150 mm at 0.3 ton/cm² (29.42 MPa), and then CIP molding at 3.0 ton/cm² (294.2 MPa) and degreasing in air at 500° C., to obtain a compact. The compact was fired under the conditions shown in Table 11, to fabricate a sintered composite oxide compact.

The sintered composite oxide of Comparative Example 54 was evaluated in the same manner as Example 1. As a result, for the sintered composite oxide of Comparative Example 54, there were observed diffraction peaks attributable to a zinc oxide-containing hexagonal wurtzite structure phase, an aluminum- and titanium-containing $ZnTiO_3$-like structure and $Zn_2Ti_3O_8$-like structure phase, and a spinel oxide phase of zinc aluminate with zinc and aluminum in solid solution. However, no diffraction peak attributable to an aluminum oxide phase or titanium oxide phase was detected.

The mean particle sizes of the particles were also determined in the same manner as Example 1. The evaluation results for the sintered composite oxide of Comparative Example 54 are shown in Table 12.

A sputtering target for Comparative Example 54 was fabricated and evaluated in the same manner as Example 1. The number of anomalous discharges produced per hour during sputtering is listed as "discharge property" in Table 12.

The sputtering target of Comparative Example 54 was used in the same manner as Example 1 to form a film by DC magnetron sputtering, to obtain a transparent conductive oxide film for Comparative Example 54. The sputtering film formation conditions were the same as in Example 1. The resistance, transmittance and durability of the transparent conductive oxide film are shown in Table 12.

The generated phases of the transparent conductive oxide film were measured in the same manner as Example 1. As a result, the transparent conductive oxide film of Comparative Example 54 was found to be composed entirely of a hexagonal wurtzite structure phase.

TABLE 10

| | Final composition of powder and sintered composition (atomic ratio) | | | Sintered composite oxide properties | | | | | | | |
|---|---|---|---|---|---|---|---|---|---|---|---|
| | | | | Mean particle size (μm) | | Crystal phase (X-ray diffraction test) | | | | | Relative density (%) |
| | (Al + Ti)/ (Zn + Al + Ti) | Al/ (Zn + Al + Ti) | Ti/ (Zn + Al + Ti) | Particles (A) | Particles (B) | (1) | (2) | Ax/ (Ax + Ay) | (3) | (4) | |
| Comp. Ex. 27 | 0.000 | 0.000 | 0.000 | 19.4 | — | yes | no | — | no | no | 96.1 |
| Comp. Ex. 28 | 0.010 | 0.010 | 0.000 | 12.0 | — | yes | no | — | yes | no | 97.3 |
| Comp. Ex. 29 | 0.020 | 0.020 | 0.000 | 5.2 | — | yes | no | — | yes | no | 97.9 |
| Comp. Ex. 30 | 0.027 | 0.027 | 0.000 | 6.0 | — | yes | no | — | yes | no | 98.8 |
| Comp. Ex. 31 | 0.032 | 0.032 | 0.000 | 5.4 | — | yes | no | — | yes | no | 98.6 |
| Comp. Ex. 32 | 0.003 | 0.000 | 0.003 | 17.8 | 2.4 | yes | yes | 0.11 | no | no | 99.0 |
| Comp. Ex. 33 | 0.030 | 0.027 | 0.003 | 6.7 | 1.1 | yes | yes | 0.12 | no | no | 99.2 |
| Comp. Ex. 34 | 0.020 | 0.000 | 0.020 | 5.4 | 1.6 | yes | yes | 0.55 | no | no | 99.2 |
| Comp. Ex. 35 | 0.047 | 0.027 | 0.020 | 7.3 | 2.3 | yes | yes | 0.52 | no | no | 99.4 |
| Comp. Ex. 36 | 0.052 | 0.027 | 0.025 | 7.3 | 2.2 | yes | yes | 0.55 | no | no | 99.4 |
| Comp. Ex. 37 | 0.038 | 0.000 | 0.038 | 5.1 | 1.8 | yes | yes | 0.68 | no | no | 99.3 |
| Comp. Ex. 38 | 0.058 | 0.020 | 0.038 | 5.9 | 0.6 | yes | yes | 0.51 | no | no | 99.4 |
| Comp. Ex. 39 | 0.057 | 0.010 | 0.047 | 3.8 | 0.4 | yes | yes | 0.70 | no | no | 99.4 |
| Comp. Ex. 40 | 0.058 | 0.003 | 0.055 | 9.2 | 0.7 | yes | yes | 0.68 | no | no | 99.5 |
| Comp. Ex. 41 | 0.013 | 0.010 | 0.003 | 28.5 | 8.8 | yes | yes | 0.31 | no | no | 99.4 |
| Comp. Ex. 42 | 0.013 | 0.010 | 0.003 | 6.8 | 0.6 | yes | yes | 0.24 | yes | yes | 86.2 |
| Comp. Ex. 43 | 0.013 | 0.010 | 0.003 | 22.7 | 6.2 | yes | yes | 0.26 | no | no | 99.4 |
| Comp. Ex. 44 | 0.020 | 0.010 | 0.010 | 18.8 | 7.6 | yes | yes | 0.41 | no | no | 99.3 |
| Comp. Ex. 45 | 0.018 | 0.008 | 0.010 | 6.2 | 0.7 | yes | yes | 0.37 | yes | yes | 86.7 |
| Comp. Ex. 46 | 0.018 | 0.008 | 0.010 | 13.6 | 5.7 | yes | yes | 0.48 | no | no | 99.4 |
| Comp. Ex. 47 | 0.045 | 0.035 | 0.010 | 6.3 | 1.1 | yes | yes | 0.42 | no | no | 99.3 |
| Comp. Ex. 48 | 0.045 | 0.035 | 0.010 | 6.4 | 1.1 | yes | yes | 0.40 | no | no | 99.3 |
| Comp. Ex. 49 | 0.045 | 0.035 | 0.010 | 6.4 | 1.1 | yes | yes | 0.40 | no | no | 99.3 |
| Comp. Ex. 50 | 0.080 | 0.070 | 0.010 | 5.2 | 1.1 | yes | yes | 0.33 | no | no | 99.1 |
| Comp. Ex. 51 | 0.025 | 0.007 | 0.018 | 8.5 | 2.4 | yes | yes | 0.48 | yes | no | 99.5 |
| Comp. Ex. 52 | 0.025 | 0.007 | 0.018 | 8.0 | 2.2 | yes | yes | 0.44 | yes | no | 99.5 |
| Comp. Ex. 53 | 0.073 | 0.003 | 0.070 | 7.0 | 1.3 | yes | yes | 0.69 | no | no | 99.5 |
| Comp. Ex. 54 | 0.028 | 0.025 | 0.003 | 5.9 | 0.7 | yes | yes | 0.17 | yes | no | 99.6 |

In Table, Particles (A) represent the particles having a hexagonal wurtzite structure, and Particles (B) represent the particles having a $ZnTiO_3$-like structure and $Zn_2Ti_3O_8$-like structure. In Crystal phase in Table, 1) represents a hexagonal wurtzite form structure phase, 2) represents a $ZnTiO_3$-like structure and $Zn_2Ti_3O_8$-like structure phase, 3) represents a zinc aluminate ($ZnAl_2O_4$) spinel oxide structure phase, and 4) represents a crystal phase other than 1) to 3), such as an aluminum oxide phase or titanium oxide phase.

TABLE 11

| | Firing conditions | | | | |
|---|---|---|---|---|---|
| | Temperature-elevating rate (° C./hr) | Firing temperature (° C.) | Firing time (hr) | Firing atmosphere | Temperature-lowering rate (° C./hr) |
| Comp. Ex. 27 | 50 | 1100 | 3 | Nitrogen | 100 |
| Comp. Ex. 28 | 50 | 1200 | 3 | Nitrogen | 100 |
| Comp. Ex. 29 | 50 | 1200 | 3 | Nitrogen | 100 |
| Comp. Ex. 30 | 50 | 1200 | 3 | Nitrogen | 100 |
| Comp. Ex. 31 | 50 | 1200 | 3 | Nitrogen | 100 |
| Comp. Ex. 32 | 50 | 1200 | 3 | Nitrogen | 100 |
| Comp. Ex. 33 | 50 | 1200 | 3 | Nitrogen | 100 |
| Comp. Ex. 34 | 50 | 1200 | 3 | Nitrogen | 100 |
| Comp. Ex. 35 | 50 | 1200 | 3 | Nitrogen | 100 |
| Comp. Ex. 36 | 50 | 1200 | 3 | Nitrogen | 100 |
| Comp. Ex. 37 | 50 | 1200 | 3 | Nitrogen | 100 |
| Comp. Ex. 38 | 50 | 1200 | 3 | Nitrogen | 100 |
| Comp. Ex. 39 | 50 | 1200 | 3 | Nitrogen | 100 |
| Comp. Ex. 40 | 50 | 1200 | 3 | Nitrogen | 100 |
| Comp. Ex. 41 | 50 | 1550 | 3 | Nitrogen | 100 |
| Comp. Ex. 42 | 50 | 750 | 3 | Nitrogen | 100 |
| Comp. Ex. 43 | 50 | 1200 | 30 | Nitrogen | 100 |
| Comp. Ex. 44 | 50 | 1550 | 3 | Nitrogen | 100 |
| Comp. Ex. 45 | 50 | 750 | 3 | Nitrogen | 100 |
| Comp. Ex. 46 | 50 | 1200 | 30 | Nitrogen | 100 |
| Comp. Ex. 47 | 50 | 1300 | 5 | Nitrogen | 100 |
| Comp. Ex. 48 | 50 | 1300 | 5 | Nitrogen | 100 |
| Comp. Ex. 49 | 50 | 1300 | 5 | Nitrogen | 100 |
| Comp. Ex. 50 | 50 | 1300 | 5 | Nitrogen | 100 |
| Comp. Ex. 51 | 50 | 1400 | 2 | Air | 100 |
| Comp. Ex. 52 | 50 | 1400 | 2 | Air | 100 |
| Comp. Ex. 53 | 50 | 1200 | 3 | Nitrogen | 100 |
| Comp. Ex. 54 | 50 | 1200 | 2 | Nitrogen | 100 |

TABLE 12

| | Target properties | | Properties of transparent conductive oxide film | | | |
|---|---|---|---|---|---|---|
| | Center line average roughness (μm) | Discharge property (times/hr) | Sheet resistance (Ω/□) | Transmittance (%) | | Durability (%) |
| | | | | Visible region (400-800 nm) | Infrared region (800-1200 nm) | |
| Comp. Ex. 27 | 0.58 | 68.3 | 1560.0 | 84.7 | 90.5 | 999.0 |
| Comp. Ex. 28 | 0.55 | 20.8 | 14.8 | 89.5 | 93.1 | 344.0 |
| Comp. Ex. 29 | 0.42 | 13.7 | 6.2 | 88.6 | 82.3 | 354.0 |
| Comp. Ex. 30 | 0.48 | 18.4 | 3.5 | 88.5 | 75.2 | 81.3 |
| Comp. Ex. 31 | 0.48 | 20.5 | 3.4 | 87.3 | 71.0 | 15.2 |
| Comp. Ex. 32 | 0.37 | 50.2 | 21.8 | 85.3 | 82.2 | 255.3 |
| Comp. Ex. 33 | 0.41 | 15.7 | 15.8 | 86.8 | 74.3 | 18.7 |
| Comp. Ex. 34 | 0.35 | 19.6 | 45.2 | 86.0 | 81.0 | 224.0 |
| Comp. Ex. 35 | 0.38 | 25.3 | 6.5 | 87.1 | 75.3 | 2.7 |
| Comp. Ex. 36 | 0.43 | 10.9 | 8.4 | 86.8 | 77.2 | 2.9 |
| Comp. Ex. 37 | 0.43 | 29.4 | 50.3 | 85.7 | 80.2 | 45.8 |
| Comp. Ex. 38 | 0.44 | 11.8 | 32.7 | 86.8 | 80.4 | 2.5 |
| Comp. Ex. 39 | 0.33 | 6.0 | 33.1 | 87.0 | 82.2 | 1.9 |
| Comp. Ex. 40 | 0.36 | 9.4 | 35.8 | 85.7 | 80.1 | 4.1 |
| Comp. Ex. 41 | 0.38 | 30.1 | 12.5 | 89.0 | 88.3 | 24.2 |
| Comp. Ex. 42 | 0.51 | 24.8 | 12.1 | 89.1 | 89.5 | 23.1 |
| Comp. Ex. 43 | 0.39 | 26.8 | 12.4 | 88.7 | 88.5 | 22.5 |
| Comp. Ex. 44 | 0.38 | 23.2 | 8.2 | 89.3 | 85.6 | 3.6 |
| Comp. Ex. 45 | 0.50 | 20.9 | 8.8 | 89.3 | 85.8 | 3.8 |
| Comp. Ex. 46 | 0.44 | 21.8 | 8.4 | 89.4 | 85.1 | 3.3 |
| Comp. Ex. 47 | 0.43 | 11.3 | 6.8 | 89.0 | 63.8 | 3.8 |
| Comp. Ex. 48 | 0.43 | 15.5 | 6.8 | 88.8 | 63.8 | 4.0 |
| Comp. Ex. 49 | 0.43 | 15.5 | 28.3 | 66.7 | 78.7 | 62.3 |
| Comp. Ex. 50 | 0.32 | 12.6 | 38.2 | 86.3 | 75.5 | 2.6 |
| Comp. Ex. 51 | 0.46 | 42.3 | 13.5 | 88.1 | 86.2 | 2.7 |
| Comp. Ex. 52 | 0.46 | 45.0 | 14.0 | 88.0 | 86.5 | 2.5 |
| Comp. Ex. 53 | 0.38 | 22.3 | 61.4 | 82.6 | 88.3 | 21.7 |
| Comp. Ex. 54 | 0.47 | 48.3 | 5.4 | 82.7 | 88.1 | 22.0 |

The transparent conductive oxide films were judged to be able to withstand practical use without device design problems if they had the following levels of resistance, light transmittance and durability. Specifically, the preferred resistance is a sheet resistance of no greater than 30 Ω/sq. with a film thickness of up to 1000 nm, as measured by the method indicated in the examples.

The light transmittance is desirably a mean value of at least 80% in wavelength ranges of both the visible region (400-800 nm) and the infrared region (800-1200 nm), as the transmittance of the film itself, as measured by the method indicated in the examples. The durability is desirably no greater than 30% as the change in resistance, according to the durability test method indicated in the examples.

When Examples 1 to 17 are compared with Comparative Examples 1 to 14, anomalous discharge during sputtering is reduced in the examples. Also, Examples 1 to 17 had low resistance and higher transmittance, as well as superior durability.

When Example 2 is compared with Comparative Examples 15 to 17, Example 6 is compared with Comparative Examples 18 to 20 and Example 10 is compared with Comparative Examples 25 to 26, it is seen that a different mean particle size of the crystal phase, or a different crystal phase in the sintered composite oxide, resulted in more anomalous discharge during sputtering even when the composition was in the range of the invention.

Figure 2:
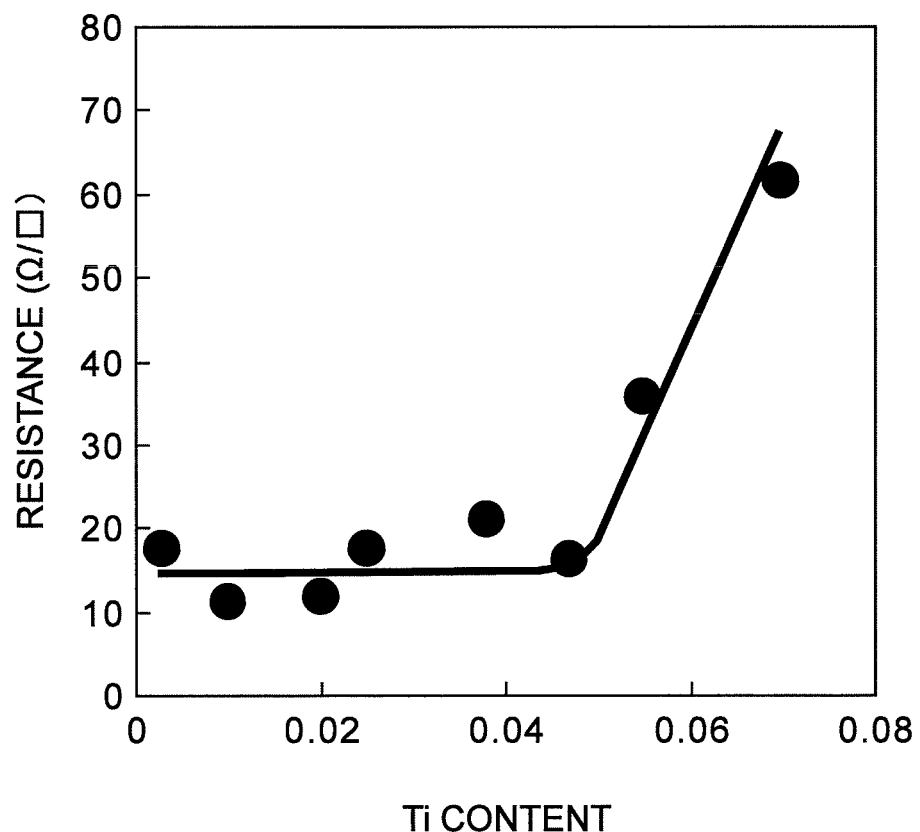
FIG. 2 is a graph showing the relationship between Ti content (Ti/(Zn+Al+Ti)) and resistance measured in the examples and comparative examples.

When Examples 1, 5, 12, 15, 17 and 48 are compared with Comparative Examples 14 and 53, it is seen that Comparative Examples 14 and 53 have high resistance above the resistance judged necessary to withstand practical use. FIG. 2 is a graph plotting the values for the examples and comparative examples, with Ti/(Zn+Al+Ti) on the abscissa and sheet resistance on the ordinate.

Figure 3:
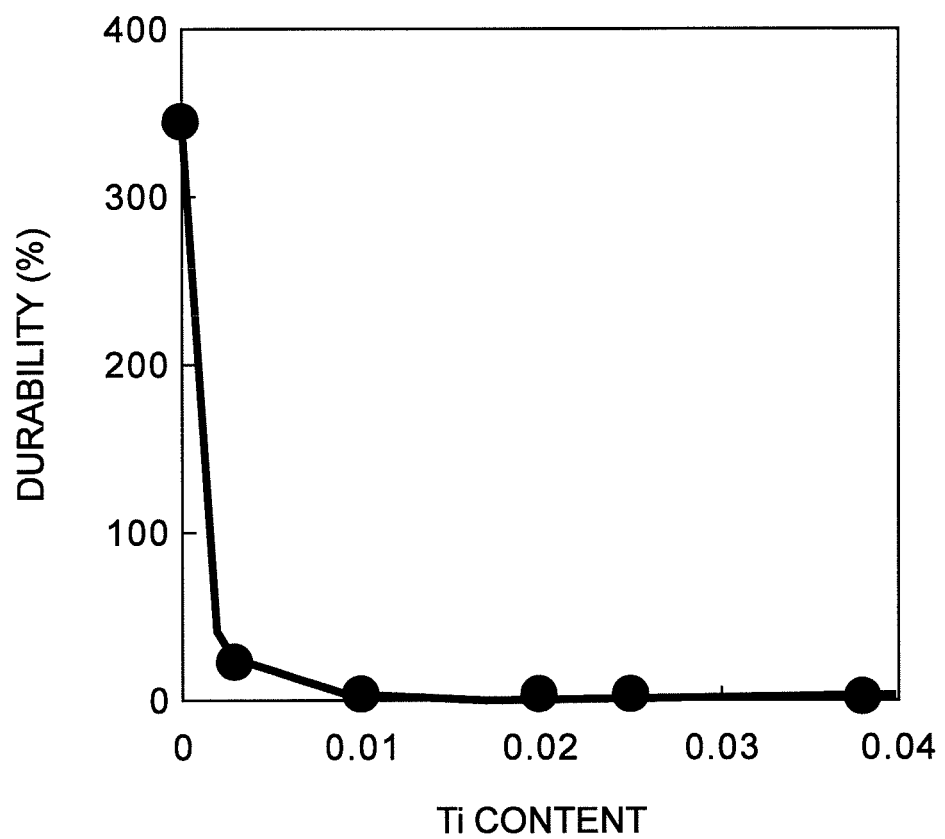
FIG. 3 is a graph showing the relationship between Ti content (Ti/(Zn+Al+Ti)) and durability measured in the examples and comparative examples.

When Examples 2, 13, 16, 45 and 49 are compared with Comparative Example 2, it is seen that Comparative Example 2 has inferior durability far below the level judged necessary to withstand practical use. FIG. 3 is a graph plotting the values for the examples and comparative examples, with Ti/(Zn+Al+Ti) on the abscissa and durability on the ordinate.

Figure 4:
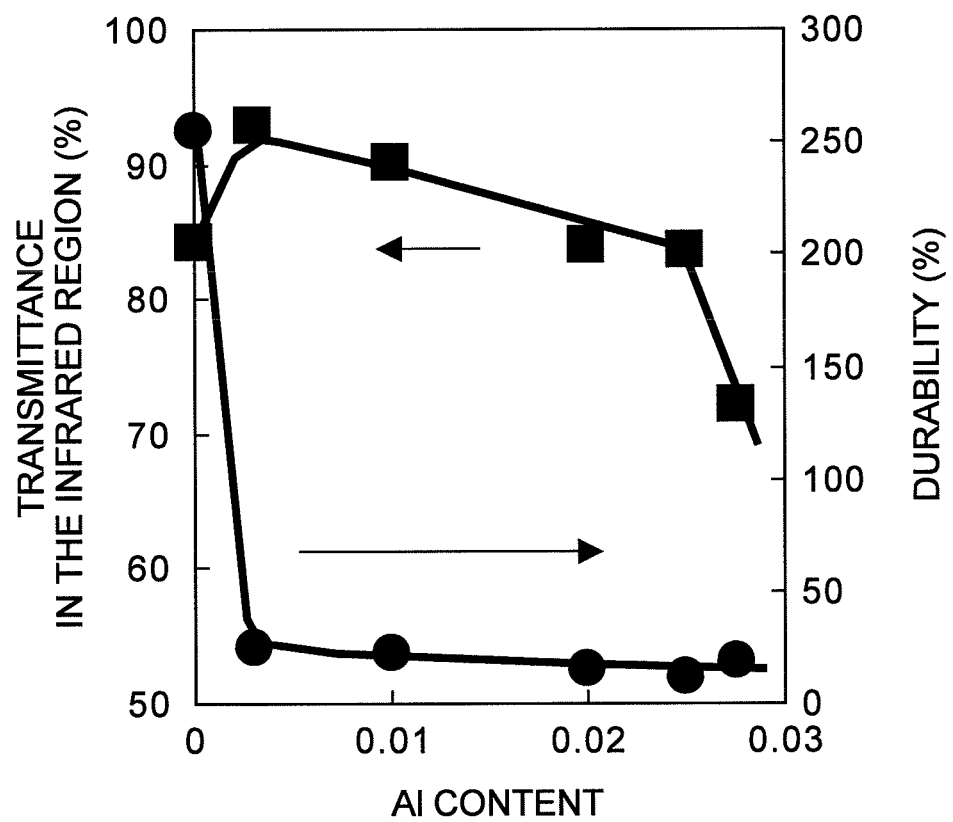
FIG. 4 is a graph showing the relationship between Al content (Al/(Zn+Al+Ti)) and transmittance in the infrared region and durability, measured in the examples and comparative examples.

When Examples 1, 2, 3 and 4 are compared with Comparative Examples 6 and 33, it is seen that Comparative Example 6 has extremely inferior durability below the level judged necessary to withstand practical use. Comparative Example 33 has transmittance below the level judged necessary to withstand practical use. FIG. 4 is a graph plotting the values for the examples and comparative examples, with Al/(Zn+Al+Ti) on the abscissa, transmittance in the infrared region on the left ordinate and durability on the right ordinate.

Figure 5:
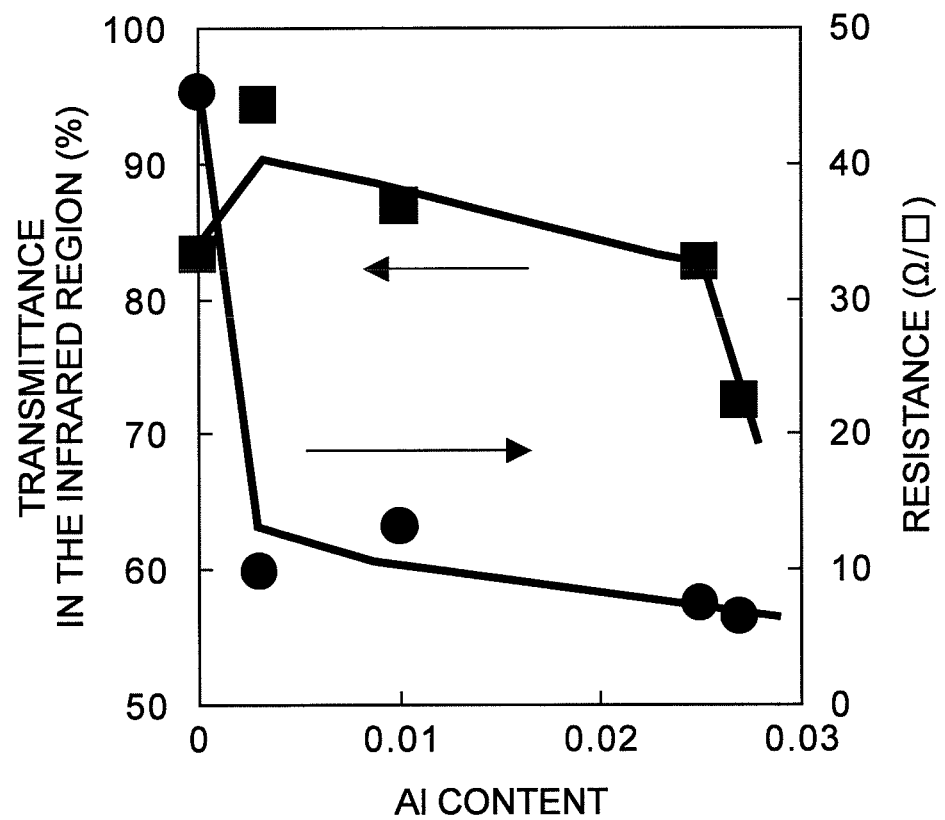
FIG. 5 is a graph showing the relationship between Al content (Al/(Zn+Al+Ti)) and transmittance in the infrared region and resistance, measured in the examples and comparative examples.

When Examples 48, 49 and 50 are compared with Comparative Examples 8 and 9, it is seen that Comparative Example 8 has high resistance above the resistance judged necessary to withstand practical use, while Comparative Example 9 exhibits low transmittance below the transmittance judged necessary to withstand practical use. FIG. 5 is a graph plotting the values for the examples and comparative examples, with Al/(Zn+Al+Ti) on the abscissa, transmittance in the infrared region on the left ordinate and sheet resistance on the right ordinate.

INDUSTRIAL APPLICABILITY

According to the invention there is provided a sputtering target that allows production of a transparent conductive oxide film while minimizing anomalous discharge during sputtering, and a sintered composite oxide to be used for the same. The transparent conductive oxide film to be produced has excellent optical transparency not only in the visible region but also in the infrared region, and excellent durability. Therefore, when it is used in a solar cell, for example, it can utilize sunlight energy in the infrared region in a highly efficient manner. It is therefore possible to provide a solar cell with high photoelectric conversion efficiency.

Explanation of Symbols

2: Sintered composite oxide

The invention claimed is:

1. A sintered composite oxide composed mainly of zinc, aluminum, titanium and oxygen,
the atomic ratio of the elements composing the sintered material satisfying the following equations (1), (2) and (3),
the sintered material comprising particles having a hexagonal wurtzite structure containing zinc oxide as the major component and having a mean particle size of no greater than 20 μm, and
particles having a $ZnTiO_3$-like structure and/or $Zn_2Ti_3O_8$-like structure containing aluminum and titanium and having a mean particle size of no greater than 5 μm,
and containing no particles with a spinel oxide structure of zinc aluminate with zinc and aluminum in solid solution, $$(Al+Ti)/(Zn+Al+Ti)=0.004\text{-}0.055 \qquad (1)$$

$$Al/(Zn+Al+Ti)=0.002\text{-}0.025 \qquad (2)$$

$$Ti/(Zn+Al+Ti)=0.002\text{-}0.048 \qquad (3)$$

wherein in said equations (1), (2) and (3), Al, Ti and Zn represent the contents in atomic percents of aluminum, titanium and zinc, respectively.

2. The sintered composite oxide according to claim 1, wherein the sintered composite oxide contains no aluminum oxide particles and titanium oxide particles.

3. A sputtering target comprising a sintered composite oxide according to claim 2.

4. The sputtering target according to claim 3, having a sputtering surface with a center line average roughness Ra of no greater than 3 μm.

5. A sputtering target comprising a sintered composite oxide according to claim 1.

6. A manufacturing method for a transparent conductive oxide film, comprising a step of sputtering using the sputtering target according to claim 5.

7. The sputtering target according to claim 5, having a sputtering surface with a center line average roughness Ra of no greater than 3 μm.

8. A manufacturing method for a transparent conductive oxide film, comprising a step of sputtering using the sputtering target according to claim 7.

9. A manufacturing method for a sintered composite oxide, comprising:
a step in which a powder as an aluminum source and a powder as a titanium source are pre-mixed and calcined to obtain a first mixed powder with a mean particle size of no greater than 1 μm,
a step in which zinc oxide powder is added to and mixed with the first mixed powder to obtain a second mixed powder satisfying the following equations (1), (2) and (3) represented as the atomic ratios of the metal elements, and
a step in which the second mixed powder is molded and fired at 800° C. to 1500° C. to obtain a sintered composite oxide according to claim 1 or 2, $$(Al+Ti)/(Zn+Al+Ti)=0.004\text{-}0.055 \qquad (1)$$

$$Al/(Zn+Al+Ti)=0.002\text{-}0.025 \qquad (2)$$

$$Ti/(Zn+Al+Ti)=0.002\text{-}0.048 \qquad (3)$$

wherein in said equations (1), (2) and (3), Al, Ti and Zn represent the contents in atomic percents of aluminum, titanium and zinc, respectively.

* * * * *